(12) United States Patent
Rutherglen

(10) Patent No.: US 9,379,327 B1
(45) Date of Patent: Jun. 28, 2016

(54) PHOTOLITHOGRAPHY BASED FABRICATION OF 3D STRUCTURES

(71) Applicant: Carbonics Inc., Marina del Rey, CA (US)

(72) Inventor: Christopher Michael Rutherglen, Torrance, CA (US)

(73) Assignee: Carbonics Inc., Marina del Rey, CA (US)

( * ) Notice: Subject to any disclaimer, the term of this patent is extended or adjusted under 35 U.S.C. 154(b) by 0 days.

(21) Appl. No.: 14/572,649

(22) Filed: Dec. 16, 2014

(51) Int. Cl.
  *H01L 21/3205* (2006.01)
  *H01L 51/00* (2006.01)
  *H01L 51/05* (2006.01)

(52) U.S. Cl.
  CPC ........ *H01L 51/0023* (2013.01); *H01L 51/0048* (2013.01); *H01L 51/055* (2013.01)

(58) Field of Classification Search
  None
  See application file for complete search history.

(56) References Cited

U.S. PATENT DOCUMENTS

| | | | |
|---|---|---|---|
| 4,849,376 A | 7/1989 | Balzan et al. | |
| 4,959,326 A | 9/1990 | Roman et al. | |
| 5,559,349 A | 9/1996 | Cricchi et al. | |
| 5,861,327 A * | 1/1999 | Maeng | H01L 21/0274 257/E21.027 |
| 5,920,790 A | 7/1999 | Wetzel | |
| 5,981,319 A * | 11/1999 | Lothian et al. | 438/167 |
| 6,207,546 B1 | 3/2001 | Chen | |
| 6,333,016 B1 | 12/2001 | Resasco et al. | |
| 6,361,861 B2 | 3/2002 | Gao et al. | |
| 6,440,761 B1 | 8/2002 | Choi | |
| 6,646,598 B1 | 11/2003 | Timothy et al. | |
| 6,660,646 B1 | 12/2003 | Elmadjian | |
| 6,756,026 B2 | 6/2004 | Colbert et al. | |
| 6,882,051 B2 | 4/2005 | Majumdar et al. | |
| 7,160,532 B2 | 1/2007 | Liu et al. | |
| 7,220,628 B2 * | 5/2007 | Kon | H01L 21/0272 257/E21.014 |
| 7,288,321 B2 | 10/2007 | Liu et al. | |

(Continued)

FOREIGN PATENT DOCUMENTS

WO  WO2011/137404  11/2011
WO  WO2012/135380  10/2012

OTHER PUBLICATIONS

Ago et al., "Aligned growth of isolated single-walled carbon nanotubes programmed by atomic arrangement of substrate surface," Chemical Physics Letters, 408(4-6):433-438, May 2005.

(Continued)

*Primary Examiner* — Benjamin Sandvik
*Assistant Examiner* — Herve Assouman
(74) *Attorney, Agent, or Firm* — Fish & Richardson P.C.

(57) ABSTRACT

A method includes depositing a first photoresist layer having a first thickness above a substrate, defining a first opening in the first photoresist layer by exposing the first photoresist layer to radiation, the first opening having a first width. The method includes depositing a conformal passivation layer directly on the first photoresist layer, and depositing a second photoresist layer having a second thickness on the conformal passivation layer. The method includes defining a second opening in the second photoresist layer by exposing the second photoresist layer to radiation, the second opening having a second width greater than the first width, and depositing a metal layer above the first photoresist layer and the substrate to form an electrode, a dielectric layer being provided to contact the metal layer. The method includes removing the first photoresist layer and the second photoresist layer. The first photoresist layer can include a positive photoresist.

18 Claims, 22 Drawing Sheets

(56) References Cited

U.S. PATENT DOCUMENTS

| | | | |
|---|---|---|---|
| 7,338,554 B2 | 3/2008 | Delaunay et al. | |
| 7,368,791 B2 | 5/2008 | Zhang et al. | |
| 7,394,118 B2 | 7/2008 | Zhou | |
| 7,413,942 B2 | 8/2008 | Pellens | |
| 7,419,651 B2 | 9/2008 | Smalley et al. | |
| 7,438,844 B2 | 10/2008 | Huang et al. | |
| 7,511,206 B2 | 3/2009 | Hiraoka et al. | |
| 7,576,971 B2 | 8/2009 | Lipka et al. | |
| 7,662,652 B2 | 2/2010 | Zhou | |
| 7,687,876 B2 | 3/2010 | Kabir | |
| 7,692,222 B2 * | 4/2010 | Tabatabaie et al. | 257/284 |
| 7,709,860 B2 | 5/2010 | Dang | |
| 7,714,386 B2 | 5/2010 | Pesetski et al. | |
| 7,776,764 B2 | 8/2010 | Cho et al. | |
| 7,834,530 B2 | 11/2010 | Manohara et al. | |
| 7,858,454 B2 * | 12/2010 | Kalburge | B82Y 10/00 257/24 |
| 8,063,451 B2 | 11/2011 | Zhang et al. | |
| 8,066,842 B2 | 11/2011 | Farmer et al. | |
| 8,106,430 B2 | 1/2012 | Cho et al. | |
| 8,124,976 B2 | 2/2012 | Takeda et al. | |
| 8,187,746 B2 | 5/2012 | Chen et al. | |
| 8,324,087 B2 | 12/2012 | Zhou et al. | |
| 8,354,291 B2 | 1/2013 | Zhou | |
| 8,692,230 B2 | 4/2014 | Zhou | |
| 8,796,096 B2 | 8/2014 | Farmer et al. | |
| 2002/0130311 A1 | 9/2002 | Lieber et al. | |
| 2003/0107065 A1 | 6/2003 | Taniguchi et al. | |
| 2004/0018371 A1 | 1/2004 | Mao | |
| 2004/0036128 A1 | 2/2004 | Zhang et al. | |
| 2004/0043219 A1 | 3/2004 | Ito et al. | |
| 2004/0240156 A1 | 12/2004 | Norton et al. | |
| 2005/0189883 A1 | 9/2005 | Suh et al. | |
| 2006/0055857 A1 | 3/2006 | Hsieh | |
| 2006/0113510 A1 | 6/2006 | Luo et al. | |
| 2007/0281409 A1 | 12/2007 | Zhang et al. | |
| 2008/0008844 A1 | 1/2008 | Bettge et al. | |
| 2008/0158778 A1 | 7/2008 | Lipka et al. | |
| 2008/0173864 A1 | 7/2008 | Fujita et al. | |
| 2008/0182369 A1 | 7/2008 | Jeong et al. | |
| 2008/0247118 A1 | 10/2008 | Long et al. | |
| 2008/0261342 A1 | 10/2008 | Zhou | |
| 2008/0292840 A1 | 11/2008 | Majumdar et al. | |
| 2009/0045061 A1 | 2/2009 | Farrow et al. | |
| 2009/0061315 A1 | 3/2009 | Nakano et al. | |
| 2009/0085063 A1 | 4/2009 | Makiyama et al. | |
| 2009/0101962 A1 | 4/2009 | Hong et al. | |
| 2009/0146208 A1 | 6/2009 | Ban et al. | |
| 2009/0149012 A1 | 6/2009 | Brask et al. | |
| 2009/0166686 A1 | 7/2009 | Hunt et al. | |
| 2009/0184389 A1 | 7/2009 | Bertin et al. | |
| 2009/0224230 A1 | 9/2009 | Pesetski et al. | |
| 2009/0278111 A1 | 11/2009 | Pop | |
| 2010/0001255 A1 | 1/2010 | Bao et al. | |
| 2010/0065818 A1 | 3/2010 | Kim et al. | |
| 2010/0127242 A1 | 5/2010 | Zhou et al. | |
| 2010/0133511 A1 | 6/2010 | Zhou et al. | |
| 2010/0140665 A1 | 6/2010 | Singbal et al. | |
| 2010/0173462 A1 | 7/2010 | Appenzeller et al. | |
| 2010/0295097 A1 | 11/2010 | Takenaka et al. | |
| 2010/0311244 A1 | 12/2010 | Hu et al. | |
| 2011/0008968 A1 | 1/2011 | Chang | |
| 2011/0073837 A1 | 3/2011 | Zhou et al. | |
| 2011/0101302 A1 | 5/2011 | Zhou et al. | |
| 2011/0229777 A1 | 9/2011 | Mak et al. | |
| 2011/0235240 A1 | 9/2011 | Lu et al. | |
| 2011/0262772 A1 | 10/2011 | Hauge et al. | |
| 2011/0269967 A1 | 11/2011 | Shukla et al. | |
| 2011/0277813 A1 | 11/2011 | Rogers et al. | |
| 2011/0304953 A1 | 12/2011 | Zhou et al. | |
| 2011/0304955 A1 | 12/2011 | Zhou et al. | |
| 2012/0012817 A1 | 1/2012 | Hong et al. | |
| 2012/0138902 A1 | 6/2012 | Hunt et al. | |
| 2012/0248416 A1 * | 10/2012 | Zhou | B82Y 10/00 257/29 |
| 2012/0258587 A1 | 10/2012 | Kub et al. | |
| 2012/0261646 A1 | 10/2012 | Zhou et al. | |
| 2013/0119348 A1 | 5/2013 | Zhou et al. | |
| 2013/0134394 A1 | 5/2013 | Zhou et al. | |
| 2014/0077161 A1 | 3/2014 | Duan et al. | |

OTHER PUBLICATIONS

Arnold et al., "Enrichment of Single-Walled Carbon Nanotubes by Diameter in Density Gradients," Nano Lett. 5(4):713-718, 6 pages, Mar. 2005.

Arnold et al., "Sorting Carbon Nanotubes by Electronic Structure Using Density Differentiation," Nat. Nanotechnol., 1:60-65, Oct. 2006.

Artukovic et al., "Transparent and Flexible Carbon Nanotube Transistors," 2005, Nano Lett. 5(4):757-760, 4 pages.

Avouris et al., "Carbon nanotubes: nanomechanics, manipulation, and electronic devices," 1999, Applied Surface Science 141(304):201-209, 9 pages.

Avouris et al., "Carbon-Based Electronics," Oct. 2007, Nature Nanotechnology, 2:605-615, 11 pages.

Avouris, P., "Graphene: Electronic and Photonic Properties and Devices," Nano Letters, 2010, 10:4285-4294.

Bachilo et al., "Narrow (n,m)-Distribution of Single-Walled Carbon Nanotubes Grown Using a Solid Supported Catalyst," 2003, Journal of the American Chemical Society, 125(37):11186-11187.

Bachtold et al., Logic circuits with carbon nanotube transistors, Science, 294:1317-1320 Nov. 2001.

Bae et al., "Roll-to-roll production of 30-inch graphene films for transparent electrodes," Nature Nanotechnol, Jun. 2010, 5:574-578.

Bohr, "Nanotechnology Goals and Challenges for Electronic Applications," Mar. 2002, IEEE Transactions on Nanotechnology, 1(1):56-62.

Buffa et al., "Side-Wall Functionalization of Single-Walled Carbon Nanotubes with 4-Hydroxymethylaniline Followed by Polymerization of -Caprolactone," 2005, Macromolecules, 38, 8258-8263, 6 pages.

Burke, "AC performance of nanoelectronics: towards a ballistic THz nanotube transistor," Solid-State Electronics, 48(10-11): 1981-1986, Oct.-Nov. 2004.

Cao et al., "Gate Capacitance Coupling of Singled-Walled Carbon Nanotube Thin Film Transistors," 2007, Appl. Phys. Lett., vol. 90, 023516-1-023516-3, 4 pages.

Cao et al., "Medium-scale carbon nanotube thin-film integrated circuits on flexible plastic substrates," Nature, 454: 495-502, Jul. 2008.

Cao et al., "Ultrathin Films of Single-Walled Carbon Nanotubes for Electronics and Sensors: A Review of Fundamental and Applied Aspects," Advanced Materials, 2009, 21, 29-53, 25 pages.

Chan et al., "Oxidation of Carbon Nanotubes by Singlet O2," Feb. 28, 2003, Physical Review Letters, 90(8):86403-1-4 (2003), 4 pages.

Chaste et al., "Single carbon nanotube transistor at GHz frequency," Nano Lett., 8(2):525-528, Jan 2008.

Chattopadhyay et al., "A Route for Bulk Separation of Semiconducting from Metallic Single-Wall Carbon Nanotubes," 2003, J. Am. Chem. Soc., 125, 3370-3375, 6 pages.

Chen et al., "Flexible and transparent supercapacitor based on In2O3 nanowire/carbon nanotube heterogeneous films," Applied Physics Letters 94(4), 043113 http://dx.doi.org/10.1063/1.3069277, 3 pages, Jan. 2009.

Chen et al., "An Integrated Logic Circuit Assembled on a Single Carbon Nanotube," Science, 311:1735, Mar. 2006.

Chen et al., "Bulk Separative Enrichment in Metallic or Semiconducting Single-Walled Carbon Nanotubes," 2003, Nano Letters, 3(9):1245-1249, 5 pages.

Chen et al., "Chemically Doped Double-Walled Carbon Nanotubes: Cylindrical Molecular Capacitors," Jun. 27, 2003, Physical Review Letters, 90(25):257403-1-257403-1, 4 pages.

Chen et al., "Novel Method of Converting Metallic-Type Carbon Nanotubes to Semiconducting-Type Carbon Nanotube Field-Effect Transistors," 2006, Japanese Journal of Applied Physics 45(4B):3680-3685, 6 pages.

(56) References Cited

OTHER PUBLICATIONS

Chen et al., "Toward the Extraction of Single Species of Single-Walled Carbon Nanotubes Using Fluorene-Based Polymers," 2007, Nano Letters 7, 3013, 5 pages.
Clausen et al., "Advanced Manufacturing Techniques for Next Generation power FET Technology", Gallium Arsenide and Other Semiconductor Application Symposium, IEEE, http://ieeexplore.ieee.org/xpls/abs_all.jsp?arnumber=1637247&tag=1, 2005, 4 pages.
Collins et al., "Engineering carbon nanotubes and nanotube circuits using electrical breakdown," Science, 292:706-709 (Apr. 2001).
Deal et al., "Solid-State Amplifiers for Terahertz Electronics", Microwave Symposium Digest (MTT), IEEE MTT-S International, 2010, 4 pages.
Derycke et al., "Carbon Nanotube Inter- and Intramolecular Logic Gates," Nano Lett., 1(9): 453-456, Sep. 2001.
Derycke et al., "Controlling doping and carrier injection in carbon nanotube transistors," Appl. Phys. Lett., 80:2773-2775 (2002).
Dimitrakopoulos et al., "Wafer-scale epitaxial graphene growth on the Si-face of hexagonal SiC (0001) for high frequency transistors," Journal of Vacuum Science & Technology B, 28(5):985-992, Sep. 2010.
Dimitrakopoulos et al., "Organic Thin-Film Transistors: A Review of Recent Advances," 2001, IBM J. Res. Dev., 45, 11-27, 17 pages.
Ding et al., "Self-aligned U-gate carbon nanotube field-effect transistor with extremely small parasitic capacitance and drain-induced barrier lowering," ACS Nano, 2011, 5:2512-2519.
Durkop et al., "Extraordinary Mobility in Semiconducting Carbon Nanotubes," Nano Lett., 4(1):35-39, Dec. 2003 online, print 2004.
Engel et al., "Thin Film Nanotube Transistors Based on Self-Assembled, Aligned, Semiconducting Carbon Nanotube Arrays," ACS Nano, 2(12):2445-2452, Dec. 2008.
Forrest, S. R., "The Path to Ubiquitous and Low-Cost Organic Electronic Appliances on Plastic," 2004, Nature, 428, 911-918, 8 pages.
Geim and Novoselov, "The rise of graphene," Nature Materials, 2007, 6:183-191.
Gelinck et al., "Flexible Active-Matrix Displays and Shift Registers Based on Solution-Processed Organic transistors," 2004, Nat. Mater., 3, 106-110, 5 pages.
Gomez et al., "Scalable light-induced metal to semiconductor conversion of carbon nanotubes," Nano Lett., 9(10):3592-3598, Sep. 2009.
Gomez-De Arco et al., "Resonant micro-Raman spectroscopy of aligned single-walled carbon nanotubes on a-plane sapphire," 2008, Applied Physics Letters 93:123112.1-3, 3 pages.
Han et al., "High-frequency graphene voltage amplifier, Nano Lett," 2011, 11:3690-3693.
Han et al., "Template-free directional growth of single-walled carbon nanotubes on a- and r-plane sapphire," J. Am. Chem. Soc., 127:5294-5295 (2005).
Heaney and Veblen, "Observations of the alpha-beta phase transition in quartz: A review of imaging and diffraction studies and some new results," American Mineralogist, 76 :1018-1032, 1991.
Hu et al., "Percolation in Transparent and Conducting Carbon Nanotube Networks," 2004, Nano Lett., 4, 2513-2517, 5 pages.
Huang et al., "Preferential Destruction of Metallic Single-Walled Carbon Nanotubes by Laser Irradiation," 2006, J. Phys. Chem. B, 110(14):7316-7320, 5 pages.
Ishikawa et al., "Transparent Electronics Based on Transfer Printed Aligned Carbon Nanotubes on Rigid and Flexible Substrates," 2008, ACS Nano, 3, 73-79, 7 pages.
Ismach et al., "Atomic-step-templated formation of single wall carbon nanotube patterns," Angew Chem. Int. Ed., 43:6140-6143 (2004).
Javey et al, "Carbon Nanotube Transistor Arrays for Multistage Complementary Logic and Ring Oscillators," Nano Lett., 2(9):929-932, Jul. 2002.
Javey et al., "Ballistic carbon nanotube field-effect transistors," Nature, 424: 654-657, Aug. 2003.
Javey et al., "Carbon Nanotube Field-Effect Transistors with Integrated Ohmic Contacts and High-κ Gate Dielectrics," Nano Lett., 4, 447-450, Feb. 2004.
Javey et al., "Self-Aligned Ballistic Molecular Transistors and Electrically Parallel Nanotube Arrays," Nano Lett, 4(7):1319-1322, Jun. 2004.
Joselevich and Lieber, "Vectorial Growth of Metallic and Semiconducting Single-Wall Carbon Nanotubes," 2002, Nano Letters, 2(10):1137-1141, 5 pages.
Ju et al., "37.3: High Performance 2.2 QCIF Full Color AMOLED Display based on Electrophosphorescence," SID Symposium Digest of Technical Papers, 33(1):1096-1099, May 2002.
Kang et al., "High-Performance Electronics Using Dense, Perfectly Aligned Arrays of Single-Walled Carbon Nanotubes," Nature Nanotech., 2: 230-236, Mar. 2007 online, Apr. 2007 print.
Kim et al., "Raman and IR Spectroscopy of Chemically Processed Single-Walled Carbon Nanotubes," 2005, Journal of the American Chemical Society, 127, 15437-15445, 9 pages.
Kim et al., "Realization of a high mobility dual-gated graphene field-effect transistor with Al2O3 dielectric," Appl. Phys. Lett, 2009, 94, 062107.
Klauk et al., "Flexible Organic Complementary Circuits," 2005, IEEE Trans. Electron Devices, 52, 618-622, 5 pages.
Klinke et al., "Charge transfer induced polarity switching in carbon nanotube transistors," Nano Lett., 5:555-558 (2005).
Kocabas et al., "Experimental and Theoretical Studies of Transport through Large Scale, Partially Aligned Arrays of Single-Walled Carbon Nanotubes in Thin Film Type Transistors," Nano Lett., 7(5):1195-1202, 2007.
Kocabas et al., "High-Frequency Performance of Submicrometer Transistors That Use Aligned Arrays of Single-Walled Carbon Nanotubes," Nano Lett., 9(5): 1937-1943, Apr. 2009.
Kocabas et al., "Guided Growth of Large-Scale, Horizontally Aligned Arrays of Single-Walled Carbon Nanotubes and Their Use in Thin-Film Transistors," Small, 1:1110-1116 (2005).
Kocabas et al., "Radio Frequency Analog Electronics Based on Carbon Nanotube Transistors," Proc. Natl. Acad. Sci. U.S.A., 105(5): 1405-1409, Feb. 2008
Kong et al., "Alkaline metal-doped n-type semiconducting nanotubes as quantum dots," Appl. Phys. Lett., 77:3977-3979 (2000).
Krupke et al., "Separation of Metallic from Semiconducting Single-Walled Carbon Nanotubes," Science 301(5631):344-347, online Jun. 2003, print Jul. 2003.
LeMieux et al., "Self-Sorted, Aligned Nanotube Networks for Thin-Film Transistors," Jul. 2008, Science, 321,101-104, 5 pages.
Li et al., "Carbon Nanotube Transistor Operation at 2.6 GHz," Nano Lett., 4(4): 753-756, Mar. 2004.
Li et al., "Large-Area Synthesis of High-Quality and Uniform Graphene Films on Copper Foils," Science, 2009, 324:1312-1314.
Li et al., "Low operating bias and matched input-output characteristics in graphene logic inverters," Nano Lett, 2010, 10:2357-62.
Li et al., "Preferential Growth of Semiconducting Single-Walled Carbon Nanotubes by a Plasma Enhanced CVD Method," 2004, Nano Letters 4(2):317-321, 5 pages.
Liao et al., "High-speed graphene transistors with a self-aligned nanowire gate," Nature, Sep. 2010, 467:305-308.
Liao et al., "Sub-100 nm channel length graphene transistors," Nano Lett, 2010, 10:3952-6.
Lin et al., "100-GHz Transistors from Wafer-Scale Epitaxial Graphene, Science," 2010, 327:662.
Lin et al., "High-Performance Carbon Nanotube Field-Effect Transistor With Tunable Polarities," IEEE Transactions on Nanotechnology, 4:481-489 (2005).
Lin et al., "Wafer-Scale Graphene Integrated Circuit," Science, 2011, 332:1294-1297.
Liu et al., "Novel nanotube-on-insulator (NOI) approach toward single-walled carbon nanotube devices," Nano Lett., 6(1): 34-39, published online Dec. 2005, print 2006.
Liu et al., "Carbon nanotube field-effect inverters," Appl. Phys. Lett., 79(20): 3329-3331, Nov. 2001.
Mahar et al., "Development of Carbon Nanotube-Based Sensors—A Review," 2007, IEEE Sensors Journal, 7(2):266-284, 19 pages.

(56) References Cited

OTHER PUBLICATIONS

Meric et al., "Channel length scaling in graphene field-effect transistors studied with pulsed current-voltage measurements," Nano Lett, 2011, 11:1093-7.
Meric et al., "Current saturation in zero-bandgap, top-gated graphene field-effect transistors," Nature Nanotechnol, 2008, 3:654-9.
Moon et al., "Low-Phase-Noise Graphene FETs in Ambipolar RF Applications," Electron Device Letters, IEEE Mar. 2011, 32:270-272.
Moon et al., "Top-Gated Epitaxial Graphene FETs on Si-Face SiC Wafers With a Peak Transconductance of 600 mS/mm," Electron Device Letters, IEEE Apr. 2010, 31(4):260-262.
Neto et al., "The electronic properties of graphene," Reviews of Modern Physics, 2009, 81:109.
Nish et al., "Highly selective dispersion of single-walled carbon nanotubes using aromatic polymers," 2007, Nature Nanotechnology 2:640-646, 7 pages.
O'Keefe et al., "Stepper Based Sub-0.25 µm Process for mm-Wave Applications", GaAs Mantech, New Orleans 2005, 4 pages.
Park et al., "Adsorption of Atomic Hydrogen on Single-Walled Carbon Nanotubes," 2005, Journal of Physical Chemistry B 109, 8967-8972, 6 pages.
Park et al., "Generalized Chemical Reactivity of Curved Surfaces: Carbon Nanotubes," 2003, Nano Letters 3, 1273, 5 pages.
Pesetski et al., "Carbon Nanotube Field-Effect Transistor Operation at Microwave Frequencies," Appl. Phys. Lett. 88: 113103-1-113103-3, Mar. 2006.
Pimparkar et al., "Current-Voltage Characteristics of Long-Channel Nanobundle Thin-Film Transistors: A "Bottom-Up" Perspective," 2007, Electron Device Lett., 28, 157-160, 4 pages.
Pimparkar et al., "Limits of Performance Gain of Aligned CNT Over Randomized Network: Theoretical Predictions and Experimental Validation," 2007, Electron Device Lett., 28, 593-595, 3 pages.
Ryu et al., "CMOS-Analogous Wafer-Scale Nanotube-on-Insulator Approach for Submicrometer Devices and Integrated Circuits Using Aligned Nanotubes," Nano Letters, 9(1):189-197, online Dec. 2008, print 2009.
Schwierz "Graphene transistors," Nature Nanotechnology, Jul. 2010, 5:487-496.
Seo et al., "Chirality- and Diameter-Dependent Reactivity of NO2 on Carbon Nanotube Walls," 2005, Journal of the American Chemical Society, 127, 15724-15729, 6 pages.
Shim et al., "Polymer functionalization for air-stable n-type carbon nanotube field-effect transistors," J. Am. Chem. Soc., 123:11512-11513 (2001).
Sneli et al., "Application of Amorphous Silicon Field Effect Transistors in Addressable Liquid Crystal Display Panels," 1981, Appl. Phys. Lett., 24, 357-362, 6 pages.
Snow et al., "High-Mobility Carbon-Nanotube Thin-Film Transistors on a Polymeric Substrate," 2005, Appl. Phys. Lett., 86, 033105-1-033105-3, 3 pages.
Snow et al., "Random Networks of Carbon Nanotubes as an Electronic Material," Mar. 2003, Appl. Phys. Lett., 82, 145-2147, 3 pages.
Tedetti et al., "Hydroxyl radical-induced photochemical formation of dicarboxylic acids from unsaturated fatty acid (oleic acid) in aqueous solution," 2007, Journal of Photochemistry and Photobiology A, 188:135-139, 5 pages.
Thostenson et al., "Advances in the Science and Technology of Carbon Nanotubes and Their Composites: A Review," 2001, Composites Science and Technology 61:1899-1912, 14 pages.
Uchikoga, S., "Low-Temperature Polycrystalline Silicon Thin-Film Transistor Technologies for System-on-Glass Displays," 2002, MRS Bull., 27, 881-886, 6 pages.
Vasilache et al., "Air Bridges and Planar Inductors for MMICs", IEEE, Semiconductor Conference, CAS '98 Proceedings, 1998, pp. 609-612.
Vijayaraghavan et al., "Metal-Semiconductor Transition in Single-Walled Carbon Nanotubes Induced by Low-Energy Electron Irradiation," 2005, Nano Letters 5(8):1575-1579, 5 pages.

Wang et al., "Analog/RF Performance of Si Nanowire MOSFETs and the Impact of Process Variation," IEEE Trans. Electron Devices, 54(6): 1288-1294, Jun. 2007.
Wang et al., "Device study, chemical doping, and logic circuits based on transferred aligned single-walled carbon nanotubes," Appl. Phys. Lett., 93:033101-1-033101-3, Jul. 2008.
Wang et al., "Macroelectronic integrated circuits using high-performance separated carbon nanotube thin-film transistors," ACS Nano., 4(12):7123-7132, Nov. 2010 online, Dec. 2010 print.
Wang et al., "Radio frequency and linearity performance of transistors using high-purity semiconducting carbon nanotubes," ACS Nano., 5(5):4169-4176, Apr. 2011 online, May 2011 print.
Wang et al., "Wafer-Scale fabrication of separated carbon nanotube thin-film transistors for display applications," Nano Lett., 9(12):4285-4291, Nov. 2009 online.
Wang et al., "A high-performance top-gate graphene field-effect transistor based frequency doubler," Appl. Phys. Lett, 2010, 96:173104.
Wang et al., "BN/Graphene/BN Transistors for RF Applications," Electron Device Letters, IEEE 2009, 30:547-549
Wang et al., "Electronically Selective Chemical Functionalization of Carbon Nanotubes: Correlation between Raman Spectral and Electrical Responses," 2005, Journal of the American Chemical Society 127(32):11460-11468, 9 pages.
Wang et al., "Graphene-Based Ambipolar RF Mixers," IEEE Electron Device Letters, Sep. 2010, 31(9):906-908.
Wu et al., "Transparent, Conductive Carbon Nanotube Films," Science, 305(5688): 1273-1276, Aug. 2004.
Wu et al., "High-frequency, scaled graphene transistors on diamond-like carbon," Nature, Apr. 2011, 472:74-8.
Xu et al., "Quantum Capacitance Limited Vertical Scaling of Graphene Field-Effect Transistor," ACS Nano, 2011, 5:2340-2347.
Yang et al., "Triple-mode single-transistor graphene amplifier and its applications," ACS Nano, 2010, 4:5532-5538.
Zenner, "Global Aspects of Atmospheric Chemistry," H. Baumgartel, W. Grunbein, F. Hensel, Eds., Topics in Physical Chemistry (Springer, New York, 1999), pp. 10-14, 12 pages.
Zhang et al., "Comparison of Graphene Growth on Single-Crystalline and Polycrystalline Ni by Chemical Vapor Deposition," J. Phys. Chem. Lett., 1(20): 3101-3107, Oct. 2010.
Zhang et al., "Hydrogenation and Hydrocarbonation and Etching of Single-Walled Carbon Nanotubes," 2006, Journal of the American Chemical Society 128, 6026-6027, 2 pages.
Zhang et al., "Photoisomerization of a Fullerene Dimer," Feb. 2008, Journal of Physical Chemistry C, 112, 2802-2804, 3 pages.
Zhang et al., "Selective Etching of Metallic Carbon Nanotubes by Gas-Phase Reaction," Nov. 2006, Science, 314: 974-977, 5 pages.
Zhang et al., "Self-Aligned Ballistic n-Type Single-Walled Carbon Nanotube Field-Effect Transistors with Adjustable Threshold Voltage," Nano Lett, 2008, 8:3696-3701.
Zhang et al., "Transparent, Conductive, and Flexible Carbon Nanotube Films and Their Application in Organic Light-Emitting Diodes," 2006, Nano Lett., 6, 1880-1886, 7 pages.
Zheng et al., "Transition of Single-Walled Carbon Nanotubes from Metallic to Semiconducting in Field-Effect Transistors by Hydrogen Plasma Treatment," 2007, Nano Letters, 7(6):1622-1625, 4 pages.
Zhou et al., "Band Structure, Phonon Scattering, and the Performance Limit of Single-Walled Carbon Nanotube Transistors," Phys. Rev. Lett., 95, 146805-1-146805-3, Sep. 2005.
Zhou et al., "Structural Characterization and Diameter-Dependent Oxidative Stability of Single Wall Carbon Nanotubes Synthesized by the Catalytic Decomposition of CO," Dec. 14, 2001, Chemical Physics Letters, 350:6-14, 9 pages.
UPSTO Transaction History; Apr. 24, 2013; U.S. Appl. No. 12/940,674; 1 page.
PCT/US2011/034691 International Preliminary Report on Patentability, issued Nov. 6, 2012, 9 pages.
PCT/US2011/034691 International Search Report and Written Opinion, mailed Jan. 11, 2012, 13 pages.
PCT/US2012/031006 International Search Report and Written Opinion, mailed Oct. 29, 2012, 8 pages.
U.S. Appl. No. 13/492,547, filed Jun. 8, 2012, 48 pages.
U.S. Appl. No. 13/740,955, filed Jan. 14, 2013, 62 pages.

(56) References Cited

OTHER PUBLICATIONS

UPSTO Transaction History; Apr. 24, 2013; U.S. Appl. No. 12/625,543; 2 pages.
UPSTO Transaction History; Apr. 24, 2013; U.S. Appl. No. 12/728,179; 2 pages.
UPSTO Transaction History; Apr. 24, 2013; U.S. Appl. No. 13/430,457; 1 page.
UPSTO Transaction History; Apr. 24, 2013; U.S. Appl. No. 13/447,105; 1 page.
UPSTO Transaction History; Apr. 24, 2013; U.S. Appl. No. 13/492,547; 1 page.
UPSTO Transaction History; Apr. 24, 2013; U.S. Appl. No. 13/740,955; 1 page.
PCT/US2012/031006 International Preliminary Report on Patentability, issued Oct 1, 2013, 4 pages.
Meyer et al., "Self-Aligned ALD AlOx T-gate insulator for gate leakage current suppression in SiNx-passivated AlGaN/GaN HEMTs", Solid State Electronics 54 (2010) 1098-1104.
Yuan et al., "0.15 Micron Gate 6-inch pHEMT Technology by Using I-Line Stepper", CNMANTECH Conference, May 18-21, 2009.
Toukhy et al., "All i-line lift-off T-gate process and materials", AZ Electronic Materials USA Corp., 2005.
Jandhyala et al., "Atomic Layer Deposiion of Dielectrics on Graphene Using Reversibly Physisorbed Ozone", ACS Nano, vol. 6, No. 3, pp. 2722-2730, 2012.
MicroChem, "PMMA Positive Resists", retrieved from the Internet, http://web.archive,org/web/20131010132058/http://microchem.com/Prod-PMMA.htm, retrieved on Apr. 6, 2016, 2 pages.
International Application No. PCT/US15/65756, Notification of Transmittal of the International Search Report and the Written Opinion of the International Searching Authority, mailed May 2, 2016, 18 pages.

\* cited by examiner

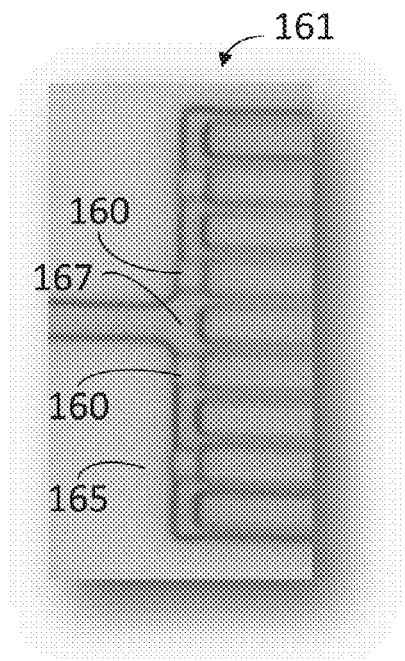
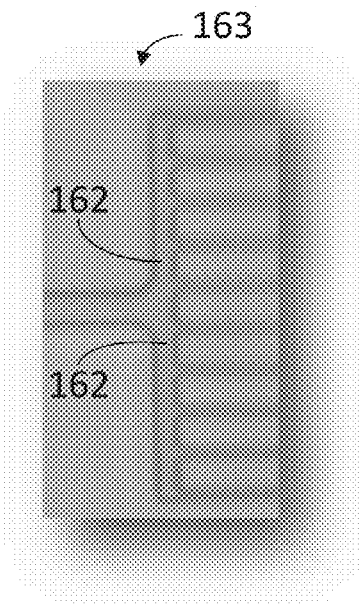
FIG. 1M   FIG. 1N
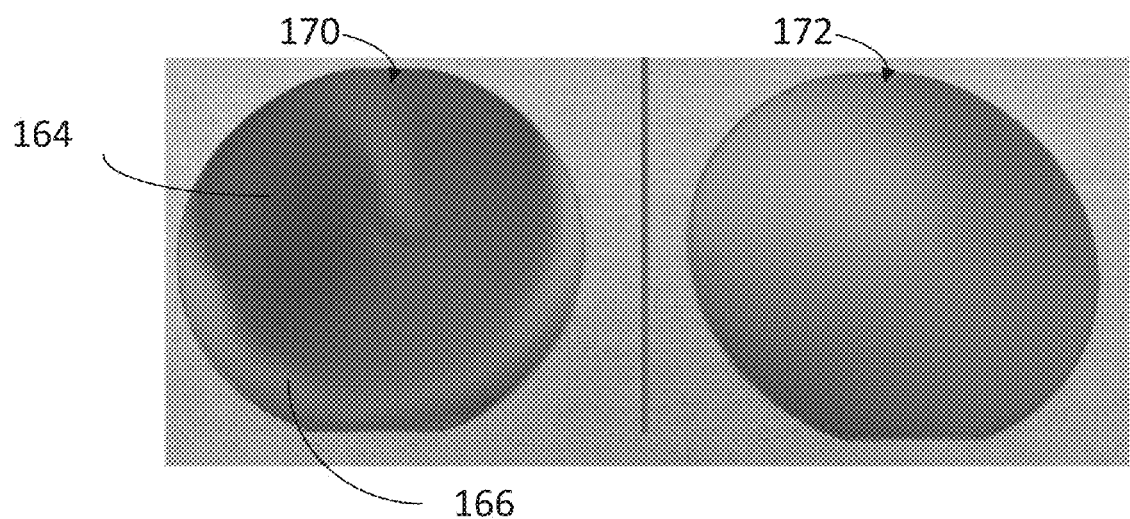
FIG. 1O

PHOTOLITHOGRAPHY BASED FABRICATION OF 3D STRUCTURES

BACKGROUND

This specification relates to photolithography based processes for fabricating three-dimensional (3D) structures. In photolithography, light is used to transfer a pattern from a mask to a light-sensitive chemical photoresist deposited on a substrate. Photolithography based fabrication processes can involve coating a photoresist above an underlying photoresist layer that has been previously patterned.

SUMMARY

Fabricating 3D structures using photolithography based processes can involve defining the 3D structures using two or more layers of photoresists. In some cases, a lower (e.g., bottom) photoresist may be incompatible with an upper (e.g., top) photoresist for a good, uniform coat of the top photoresist to be obtained. A positive photoresist is an example of such a lower photoresist, and a photoresist deposited directly on the lower photoresist may not form a uniform coat.

The methods and systems disclosed herein allow a good, uniform coat of an upper photoresist to be applied above (e.g., coated on, spun on) a lower positive photoresist by providing a passivation layer between the lower photoresist and the upper photoresist. Using such methods and systems, various 3D structures, including air-bridges and devices such as field-effect-transistors (FET) having shaped top-gate electrodes can be fabricated using scalable, photolithographic methods.

FET can have an active channel region that includes nanomaterials. Nanomaterials such as carbon nanotubes (CNT), single-walled carbon nanotubes (SWNT) can have unique properties such as high saturation velocity, large current density, low intrinsic capacitance, large mean-free paths, theoretically high linearity, and immunity to short-channel effects due to their small size.

In contrast to electron beam lithography (e-beam lithography, or EBL) based techniques of fabricating FET that contain nanomaterials, photolithography is able to integrate with standard complementary metal-oxide-semiconductor (CMOS) processes. In this way, photolithography can be a commercially relevant and economically feasible technique to fabricate radio frequency (RF) devices (e.g., FET) that utilize nanotubes. In general, such FET can be used to, for example, amplify radio-frequency, microwave, or millimeter-wave signals.

The methods and systems disclosed herein include a CMOS-compatible process for fabricating CNT FETs having a top-gate electrode, such as a T-shaped top gate structure. A T-shaped top gate structure includes a foot portion and a head portion connected to the foot portion, the head portion being wider than the foot portion. The processes, methods and systems disclosed herein can allow any recent advances in CNT radio frequency field effect transistor (rf-FET) research to be translated from EBL-based techniques into a process platform that utilizes scalable, photolithography stepper technology.

In addition, FET can also be multifinger gate transistor devices. Air-bridges are present in these multifinger gate transistor devices to prevent electrical shorting of conductor strips in the transistor. The methods and systems disclosed herein also provide a photolithographic method of fabricating such air-bridges.

Methods and systems disclosed herein allow a top-gate electrode of a top-gate nanomaterial-FET to be securely attached to a substrate of the FET, even in the presence of an intervening nanomaterial layer. This can be challenging when the thickness of the nanomaterial layer or the density of nanomaterial in such a layer is high, or when a width of a portion of the gate-electrode that directly contacts the nanomaterial layer is small.

In one aspect, methods for applying a second photoresist layer above a first photoresist layer described herein include depositing the first photoresist layer above a substrate, forming a pattern in the first photoresist layer by exposing the first photoresist layer to radiation. The methods include depositing a conformal passivation layer directly on the pattern in the first photoresist layer, depositing a second photoresist layer directly on the conformal passivation layer, and forming an opening in the second photoresist layer by exposing the second photoresist layer to radiation. The first photoresist layer includes a positive photoresist, and the pattern in the first photoresist layer remains substantially constant while forming the opening in the second photoresist layer.

Implementations can include one or more of the following features. A thickness of the conformal passivation layer is controlled using atomic layer deposition. The conformal passivation layer allows the second photoresist layer to form a uniform layer having a thickness variation of less than 5% directly on the pattern in the first photoresist layer. The conformal passivation layer includes an inorganic oxide. The passivation layer includes $Al_2O_3$. The conformal passivation layer has a thickness between 1 nm and 5 nm. A portion of voids in the pattern of the first photoresist layer is contiguous to the opening in the second photoresist. The voids and the opening collectively form a three dimensional feature that has a height that is greater than a thickness of the first photoresist layer. Forming an opening in the second photoresist layer includes using a solvent or a developer. The first photoresist layer includes ULTRA i123-0.35 and the first photoresist layer is kept at a temperature below 120° C.

The method further includes depositing a second conformal passivation layer directly on the second photoresist layer, depositing a third photoresist layer directly on the second conformal passivation layer, and forming an opening in the third photoresist layer by exposing the third photoresist layer to radiation.

In another aspect, a structure includes a first pattern formed from a first layer of a positive photoresist, a conformal passivation layer disposed over the first pattern, a second pattern formed from a second layer of a photoresist disposed on the conformal passivation layer. The conformal passivation layer includes a layer having a thickness between 1-5 nm, and the second pattern formed from the second layer of the photoresist has a thickness variation of less than 5%.

Implementations can include one or more of the following features. The conformal passivation layer includes an inorganic oxide. The passivation layer includes $Al_2O_3$, and a thickness of the $Al_2O_3$ deposited using atomic layer deposition (ALD) is between 1 nm to 3 nm. The conformal passivation layer includes $HfO_2$, and a thickness of the $HfO_2$ deposited using atomic layer deposition (ALD) is between 2 nm to 10 nm. A conformal dielectric layer is disposed directly on the second pattern. The conformal passivation layer is removed from a region of the first layer of the positive photoresist that is not underneath the second layer of the photoresist. A metal layer is deposited over the conformal dielectric layer. The conformal dielectric layer includes $HfO_2$ deposited using atomic layer deposition. A second conformal passivation layer is disposed directly on the second pattern, and a third pattern formed from of a third layer of a photoresist is disposed directly on the second conformal passivation layer.

The first layer of positive photoresist has a thickness between 200 nm and 400 nm, and a feature size of the pattern formed from the first layer of positive photoresist is between 100 nm and 500 nm. The first layer of positive photoresist includes ULTRA i123-0.35.

In one aspect, methods described herein include depositing a first photoresist layer having a first thickness above a substrate, defining a first opening in the first photoresist layer by exposing the first photoresist layer to radiation, the first opening having a first width. Depositing a conformal passivation layer directly on the first photoresist layer, depositing a second photoresist layer having a second thickness on the conformal passivation layer, defining a second opening in the second photoresist layer by exposing the second photoresist layer to radiation. The second opening having a second width greater than the first width, depositing a metal layer above the first photoresist layer and the substrate to form an electrode, a dielectric layer being provided to contact the metal layer. Removing the first photoresist layer and the second photoresist layer. The first photoresist layer includes a positive photoresist.

Implementations can include one or more of the following features. Depositing a conformal dielectric layer directly on the second photoresist layer and above the first photoresist layer. Depositing the metal layer includes depositing a metal layer directly on the conformal dielectric layer. Depositing the conformal dielectric layer includes depositing the conformal dielectric layer directly on the second photoresist layer and directly on the conformal passivation layer. The conformal dielectric layer includes $HfO_2$. The conformal passivation layer includes an inorganic oxide. The passivation layer includes $Al_2O_3$. Etching away a portion of the conformal passivation layer not covered by the second photoresist prior to depositing the conformal dielectric layer directly on the second photoresist layer. Before depositing the conformal passivation layer, baking the first photoresist at a temperature higher than a threshold temperature to reflow the first photoresist and reduce a dimension of the first opening. Applying a chemical shrink formulation or resolution enhanced lithography assisted by chemical shrink (RELACS) to reduce a dimension of the first opening before depositing the conformal passivation layer. A thickness of the conformal dielectric layer is controlled using atomic layer deposition.

The conformal dielectric layer is deposited below a threshold temperature to reduce or prevent reflow of the photoresists. The substrate has a nanomaterial layer deposited thereon, and depositing the first photoresist layer includes depositing the first photoresist layer on at least a portion of the nanomaterial layer. Depositing the nanomaterial layer on the substrate prior to depositing the first photoresist layer. The nanomaterial layer includes single wall carbon nanotubes (SWNT). Forming a self-aligned source electrode and a self-aligned drain electrode on the nanomaterial layer by using the electrode formed by the deposited metal layer as a shadow mask. A first volume defined by the first opening is contiguous to a second volume defined by the second opening, and a shape of the electrode formed by the deposited metal layer is based collectively on the first volume and second volume. The second photoresist layer includes a positive resist material and the conformal passivation layer prevents the first photoresist layer from being modified when the second opening is defined in the second photoresist layer. Defining the second opening in the second photoresist layer includes exposing and developing the second photoresist. The metal layer includes Ti. The metal layer includes Au. The first opening is between 100 to 500 nm and the second photoresist layer has a thickness that reduces deposition of metal on a sidewall of the second photoresist layer contiguous to the second opening.

In one aspect, a field-effect transistor includes a silicon substrate, a layer of nanomaterial disposed on the silicon substrate, a passivation layer disposed on the layer of nanomaterial using atomic layer deposition. A gate electrode disposed above the layer of nanomaterial, the gate electrode having a foot portion, and a head portion directly connected to the foot portion, the gate electrode being in contact with a dielectric material. A source electrode and a drain electrode are disposed on the layer of nanomaterial. A width of the foot portion is determined by a width of a first opening in a first photoresist, and a dimension of the head portion is determined by a width of a second opening in a second photoresist. A thickness of the passivation layer is between 1 nm and 5 nm.

Implementations can include one or more of the following features. The dielectric material includes a layer of dielectric material disposed on the passivation layer. The layer of dielectric material being in contact with the gate electrode is disposed on the passivation layer. The head portion of the gate electrode serves as a shadow mask for the source electrode and drain electrode to be self-aligned. The dielectric material includes a layer of dielectric material separate and different from a material of the passivation layer. The dielectric material includes $HfO_2$ and the passivation layer includes $Al_2O_3$. A length of the foot portion is between 100 nm and 500 nm. The dielectric material includes an oxide different from an oxide of the gate electrode. The gate electrode includes Ti. The gate electrode includes Au.

In one aspect, methods of forming an air-bridge described herein include depositing a first layer of photoresist directly on a conductive element disposed on a substrate, and forming openings, on both sides of the conductive element, in the first layer of photoresist. Applying a layer of conformal passivation coating directly on the first layer of photoresist, depositing a second layer of photoresist over the layer of conformal passivation coating, and forming openings in the second layer of photoresist while keeping a dimension of the openings in the first layer of photoresist constant. Depositing a layer of metal above the conformal passivation coating and into gaps formed by the openings in the first layer of photoresist. Removing the first layer of photoresist and the second layer of photoresist to form an air-bridge that includes the layer of metal. The air-bridge spans over the conductive element by connecting a first portion of the layer of metal on one side of the conductive element to a second portion of the layer of metal on another side of the conductive element. The first layer of photoresist includes a positive photoresist.

Implementations can include one or more of the following features. The conductive element includes an electrode. Depositing the layer of metal includes depositing a layer of metal having a thickness between 200 nm to 600 nm. The substrate has a nanomaterial layer deposited thereon, and depositing the first layer of photoresist includes depositing the first layer of photoresist on at least a portion of the nanomaterial layer. The nanomaterial layer includes carbon nanotubes. Depositing the nanomaterial layer on the substrate prior to depositing the first layer of photoresist. A first region of the layer of metal includes the air-bridge and a second region of the metal layer includes a first portion of a top gate electrode. The top gate electrode is a T-shaped gate electrode that has a foot portion and a head portion connected to the foot portion, the head portion is larger than the foot portion. A width of the foot portion of the T-shaped gate electrode is determined by a size of an opening in the first layer of photoresist. A width of the head portion of the T-shaped gate electrode is determined by a size of an opening in the second layer of photoresist. Depositing the layer of metal includes forming a second portion of the top gate electrode parallel to the first portion of the top gate electrode on the nanomaterial layer, forming a metallic connecting segment directly on the substrate between one end of the first portion of the top gate electrode and one end of the second portion of the top gate electrode to form a first connected pair of portions of the gate electrode. Depositing the metal layer includes forming an additional pair of portions of the gate electrode, wherein the air-bridge connects the first connected pair of portions of the gate electrode and the additional pair of portions of the gate electrode. The first connected pair of portions of the gate electrode is interdigitated with a drain electrode. The conformal passivation layer is applied using atomic layer deposition to control a thickness of the conformal passivation layer. Defining the openings in the second layer of photoresist includes exposing and developing the second layer of photoresist.

In one aspect, the device includes a substrate, a conductive element disposed on the substrate, a conformal passivation layer formed on the substrate, the conformal passivation layer spanning over the conductive element. A first metallic portion and a second metallic portion formed on the conformal passivation layer. The conductive element is disposed between the first metallic portion and the second metallic portion. An air-bridge spans over the conductive element and connects at least a portion of the first metallic portion to at least a portion of the second metallic portion. A thickness of the air-bridge, a thickness of the first metallic portion and a thickness of the second metallic portion are substantially equal.

Implementations can include one or more of the following features. A nanomaterial layer is between the substrate and the conformal passivation layer. The conformal passivation layer includes an inorganic oxide. The passivation layer includes $Al_2O_3$. The first metallic portion and second metallic portion each has a height of less than 800 nm. A conformal dielectric coating is between the substrate and the first metallic portion. The device includes a drain electrode. The first metallic portion is a first portion of a gate electrode and the second metallic portion is a second portion of the gate electrode. Portions of the gate electrode are interdigitated with portions of the drain electrode. The conductive element includes a portion of a source electrode. A third portion of the gate electrode extends parallel to the first portion of the gate electrode. A metallic connecting segment directly on the substrate between one end of the third portion of the gate electrode and one end of the first portion of the gate electrode to form a first connected pair of portions of the gate electrode. The gate electrode includes a T-shaped gate electrode having a foot portion and a head portion connected to the foot portion, the head portion being larger than the foot portion. A multifinger gate transistor that includes the device.

In one aspect, methods described herein include depositing a layer of a nanomaterial on a substrate, etching a portion of the nanomaterial to form a pattern of anchor points that are void of the nanomaterial. Depositing a source electrode and a drain electrode along a first length and a second length of the layer of the nanomaterial, respectively, such that the pattern of anchor points is between the source electrode and the drain electrode, and depositing a gate electrode on the layer of nanomaterial. The gate electrode is in contact with a dielectric material. The dielectric material has a stronger adhesion to the substrate than an adhesion between the dielectric material and the layer of nanomaterial, and the adhesion between the layer of nanomaterial and the substrate. In addition, the anchor points increase a surface area of the substrate in contact with the dielectric material.

Implementations can include one or more of the following features. Etching a portion of the nanomaterial includes using an oxygen plasma, and the layer of nanomaterial includes carbon nanotubes. The dielectric material is deposited directly on the layer of nanomaterial between the source electrode and the drain electrode. The dielectric material is deposited using atomic layer deposition, and the dielectric material has a thickness of at least 2 nm. The pattern of anchor points includes separate and distinct regions void of the nanomaterial, each of the regions extending from the source electrode to the drain electrode. Each of the regions has a width of between 100 nm and 2 μm. The pattern of anchor points includes separate and distinct regions void of the nanomaterial, each of the regions being located between the source electrode and the drain electrode and being surrounded by the nanomaterial. Each of the regions has width of between 100 nm and 2 μm and a length between 500 nm to 2 μm. The layer of nanomaterial has a thickness of at least 0.5 nm. The layer of nanomaterial has a surface coverage area of at least 0.5%. One or more of the drain electrode, the source electrode, and the gate electrode is patterned using a photoresist via photolithography. A portion of the gate electrode extends beyond the layer of nanomaterial, and the portion of the gate electrode is disposed directly on the substrate. The portion of the gate electrode has a larger foot portion than a foot portion of the gate electrode formed above the layer of nanomaterial.

In one aspect, a device includes a substrate, a layer of nanomaterial disposed on the substrate, a source electrode disposed along a first length of the layer of nanomaterial. A drain electrode disposed along a second length of the layer of nanomaterial. A pattern of anchor points within the layer of nanomaterial, the anchor points being void of the nanomaterial. A gate electrode disposed above a layer of dielectric material, and between the source electrode and the drain electrode. A portion of the layer of dielectric material is directly in contact with the substrate via the pattern of anchor points.

Implementations can include one or more of the following features. The nanomaterial includes carbon nanotubes. The pattern of anchor points includes separate and distinct regions void of the nanomaterial, each of the regions extending from the source electrode to the drain electrode. Each of the regions has a width of between 100 nm to 2 μm. The pattern of anchor points includes separate and distinct regions void of the nanomaterial. Each of the regions is located between the source electrode and the drain electrode and being surrounded by the nanomaterial. Each of the regions has a width between 100 nm and 2 μm and a length between 500 nm and 2 μm. The dielectric material is deposited using atomic layer deposition and includes an oxide different that an oxide of the gate electrode. The layer of nanomaterial has a thickness of at least 0.5 nm. The layer of nanomaterial has a surface coverage area of at least 0.5%. The gate electrode and the dielectric material have a stronger adhesion to the substrate than an adhesion between the layer of nanomaterial and the substrate. The pattern of anchor points increases a surface area of the substrate that is in contact with the layer of dielectric material and the gate electrode. A gate length defined by a width of the layer of dielectric material is less than 500 nm. A portion of the gate electrode extends beyond the layer of nanomaterial, and the portion of the gate electrode is disposed directly on the substrate. The portion of the gate electrode has a larger foot portion than a foot portion of the gate electrode formed above the layer of the nanomaterial.

The details of one or more embodiments of the subject matter described in this specification are set forth in the accompanying drawings and the description below. Other features, aspects, and advantages of the invention will become apparent from the description, the drawings, and the claims.

BRIEF DESCRIPTION OF THE DRAWINGS

FIG. 1M shows a photoresist structure.

FIG. 1N shows a photoresist structure.

FIG. 1O shows photoresists deposited on a substrate with and without a passivation layer between photoresist layers.

Like reference numbers and designations in the various drawings indicate like elements.

DETAILED DESCRIPTION

Figure 1A:
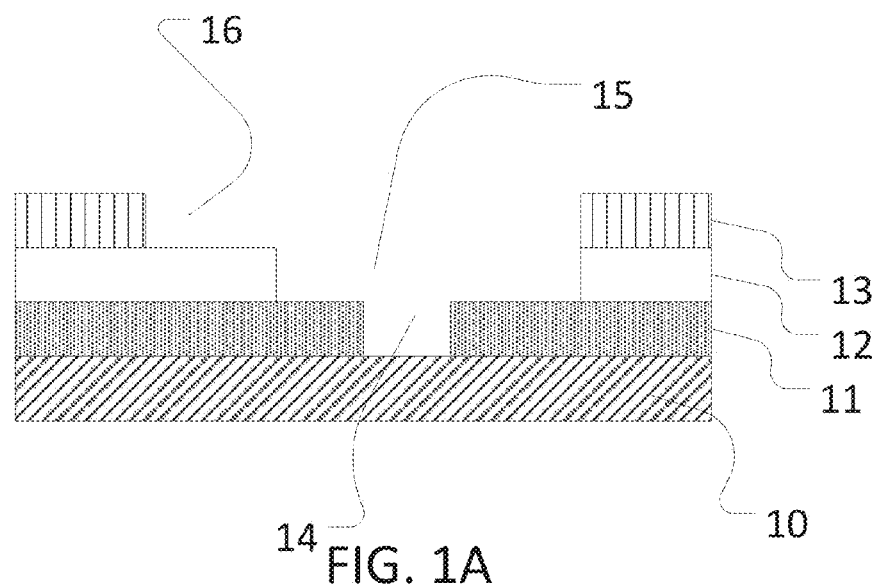
FIG. 1A shows a schematic diagram of a 3D pattern formed in layers of photoresists.
Figure 1B:
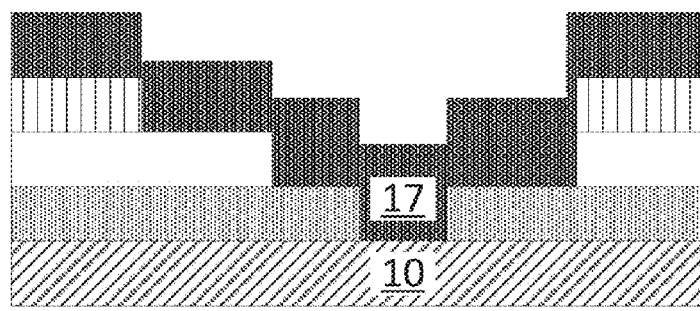
FIG. 1B shows a schematic diagram of a material being filled in the pattern shown in FIG. 1A.
Figure 1C:
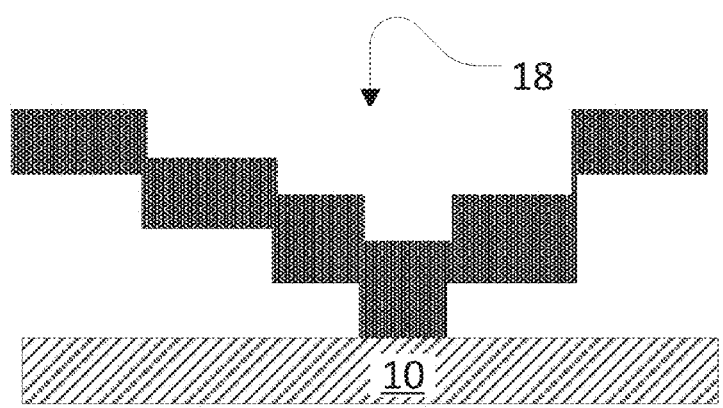
FIG. 1C shows a schematic three-dimensional structure formed using the layers of photoresists shown in FIG. 1A.
Figure 1D:
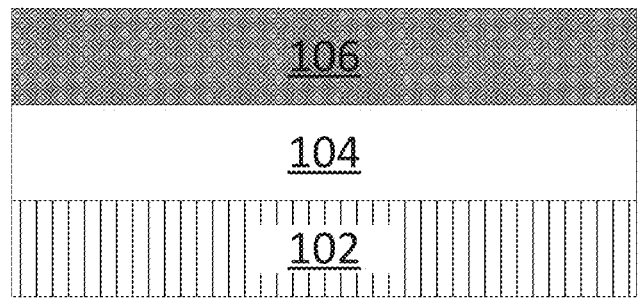
FIG. 1D shows a photoresist being deposited on a substrate.

FIGS. 1A-C illustrate how an arbitrary 3D structure 18 can be fabricated using a number of layers of photoresists. In FIG. 1A, a first photoresist (PR) 11 is deposited above a substrate 10, and an opening 14 is defined in the first photoresist 11. The opening 14 can be defined in the first photoresist by appropriately using a mask bearing a pattern that corresponds to the opening 14. Light (for example, at a wavelength of 405 nm ("h-line"), 365 nm ("i-line"), or at a smaller wavelength) can be directed at the photoresist 11 through a mask. When the first photoresist 11 is a positive resist, the portion of the photoresist that is exposed to light becomes soluble to a photoresist developer while the portion of the photoresist that is unexposed remains insoluble to the photoresist developer. When the first photoresist 11 is a negative resist, the portion of the photoresist that is exposed to light becomes insoluble to the photoresist developer while the portion of the photoresist that is unexposed is then dissolved by the photoresist developer. Thus, for both a positive photoresist and a negative photoresist, after appropriate treatment with the photoresist developer, an opening is formed in the photoresist at a location determined by the mask.

Similarly, a second photoresist 12 is deposited above the first photoresist 11. A second opening 15, larger than the opening 14, is defined in the second photoresist 12. Subsequently, a third photoresist 13 can be deposited above the second photoresist 12, before a third opening 16 is defined in the third photoresist 13. An intervening layer can be disposed between the first photoresist 11 and a second photoresist 12, which is deposited above the first photoresist 11.

In FIG. 1B, a material 17 of which the 3D structure 18 is formed, is filled into the space defined by the openings 14-16. In FIG. 1C, the three layers of photoresists 11-14 are removed, for example, by polymer removers in a liftoff process, to yield the 3D structure 18.

In general, a poor coat of photoresist having a non-uniform thickness is formed when applied to directly on an underlying positive photoresist. A uniform layer or a coat having a uniform thickness has a thickness variation of less than 1% across the substrate. In addition, the underlying photoresist layer can become dissolved or otherwise modified (e.g., having a 0.5% or more decrease in volume) by a solvent and/or a developer used to develop photoresist layer above it, thus eroding the bottom PR pattern. Examples of such solvents and developer include MF319, AZ300MIF, MF-CD26, MF-26A, etc that contain the chemical tetramethlyammonium hydroxide (TMAH).

The lower (e.g., bottom) PR layer can be conformally coated with a thin layer (e.g., between 1-5 nm) of an oxide material using atomic-layer-deposition (ALD) to obtain a uniform coat of an upper layer (e.g., top) PR above the bottom PR. A conformal coating is a coating that fully and homogenously covers an underlying surface. Conformal coatings are coatings that are applied uniformly to all surface features independent of the surface's orientation.

The thin layer of oxide material forms a conformal passivating layer that is particularly useful in ensuring a good, uniform coat of photoresist is formed above a positive photoresist. Hard baking is a bake performed at the high temperature range, but typically lower than what would cause reflow of the photoresist, aimed at strengthening the resist structure. The liftoff process is performed to remove the photoresists after the fill material has been introduced into the space defined by openings in the photoresists.

Figure 1E:
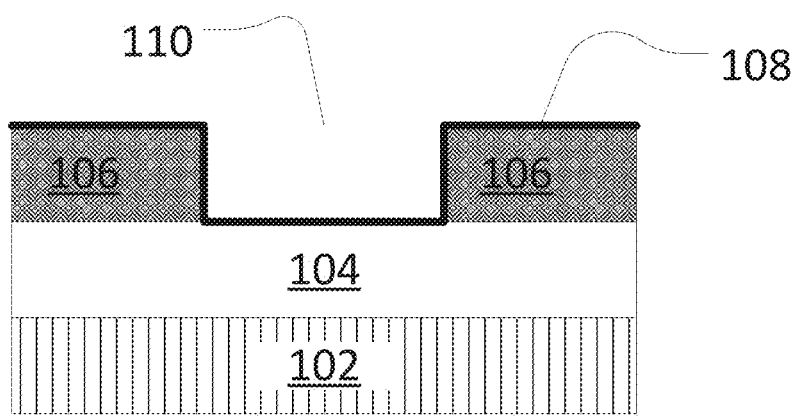
FIG. 1E shows an opening formed in the photoresist of FIG. 1D.

FIG. 1D-1G show the process of forming good, uniform coatings of photoresist above an underlying positive resist. A substrate 102 can include an optional oxide layer 104 on its top surface. The oxide layer 104 can be a thermal oxide layer. The substrate 102 can be silicon, and the oxide layer 104 can be silicon dioxide. A first layer of photoresist 106 is applied directly on the oxide layer 104 (or the substrate 102). The first layer of photoresist 106 can have a thickness of, for example, 200-1000 nm. The first layer of photoresist 106 can be a positive photoresist. However, in some implementations, the methods disclosed herein can be used with a negative photoresist. An opening 110 is defined in the photoresist 106 after exposing the photoresist to light to form a patterned photoresist layer. Thereafter, a thin layer (e.g., 1-3 nm) of an oxide material, such as $Al_2O_3$ or $HfO_2$ can be deposited by atomic layer deposition (ALD) to form a conformal passivation layer 108 on the patterned photoresist, as shown in FIG. 1E. In some embodiments, similar experimental conditions used to make the ALD dielectric layer can be used to make the passivation layer. The process for depositing the passivation layer can be terminated when a layer thickness of 1-3 nm is reached. ALD can deposit single atomic monolayers of materials on the patterned photoresist. For example, the Savannah ALD tool manufactured by Cambridge Nanotech of Waltham, Mass., can be used to deposit $Al_2O_3$ at an operating temperature of 90° C. using a water precursor pulsed for 0.25 second and purged for 30 seconds followed by a trimethylaluminum (TMA) precursor pulsed for 0.25 second and purged for 30 seconds.

Figure 1F:
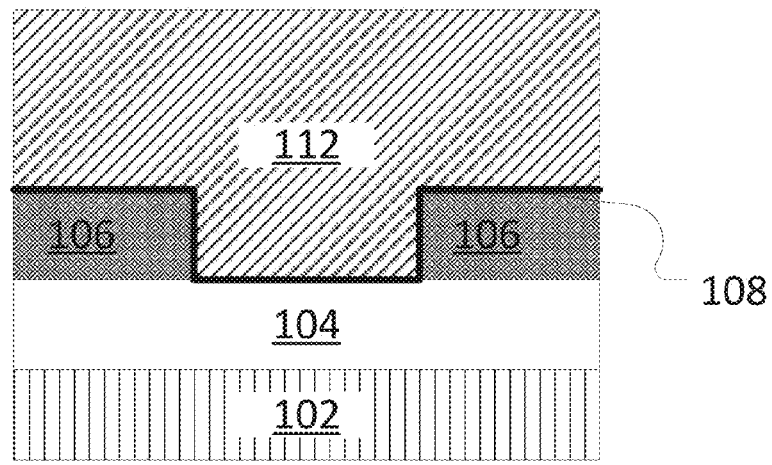
FIG. 1F shows a second photoresist filling in the opening shown in FIG. 1E.
Figure 1G:
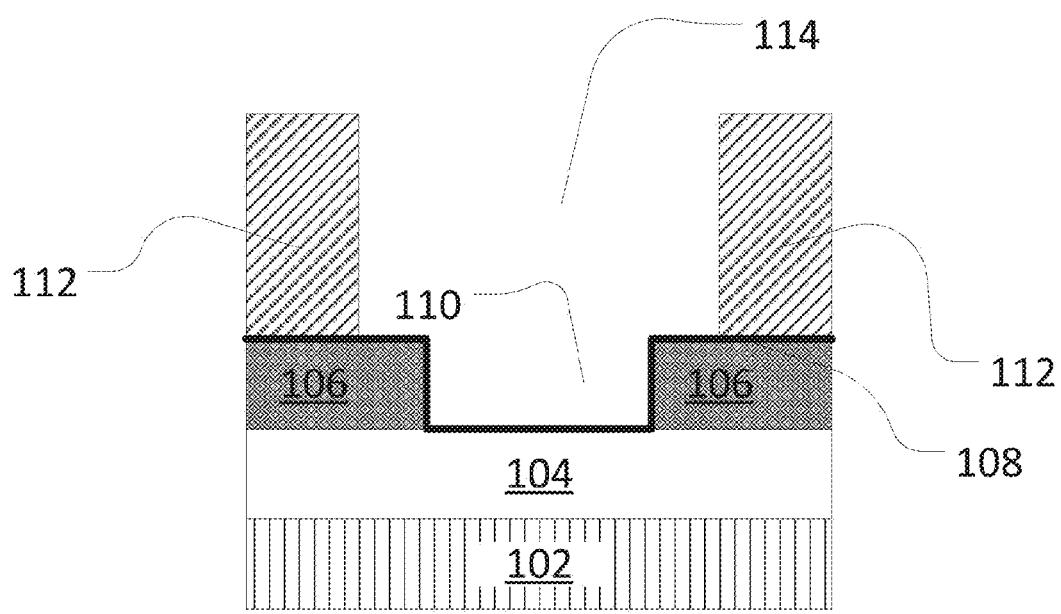
FIG. 1G shows an opening formed in the second photoresist shown in FIG. 1F.

FIG. 1F shows a second photoresist layer 112 being deposited directly on the conformal passivation layer 108. As shown, the second photoresist layer 112 can have a different thickness than that of the first photoresist layer 106. The second photoresist layer 112 can be exposed to a pattern of exposure light defined by a mask to form a second opening 114, as shown in FIG. 1G. The solvents and developers used to produce the opening 114 in the photoresist 112 do not erode the underlying patterned first photoresist layer 106 due to the presence of the conformal passivation layer 108. In other words, the patterned photoresist layer 106 can remain substantially constant while forming the opening in the second photoresist layer 112. Remaining substantially constant can mean having less than a 0.5% decrease in volume of the patterned photoresist layer 106 during and upon the formation of an opening in the second photoresist layer 112. Negative resists available for i-line photolithography generally does not spin down to a thickness of less than 500-600 nm. Since this thickness defines the trunk height dimension of the T-gate, use of negative resists may double the height of the T-gate and double the amount of metal deposited. Using a positive resist, the top photoresist layer can spin down to a target thickness of about 300 nm. Use of negative photoresists in patterning can result in an undercut profile which may assist in the lift-off of subsequently deposited conductive material. Such undercut profile is not present when a positive photoresist is patterned and developed.

Figure 1H:
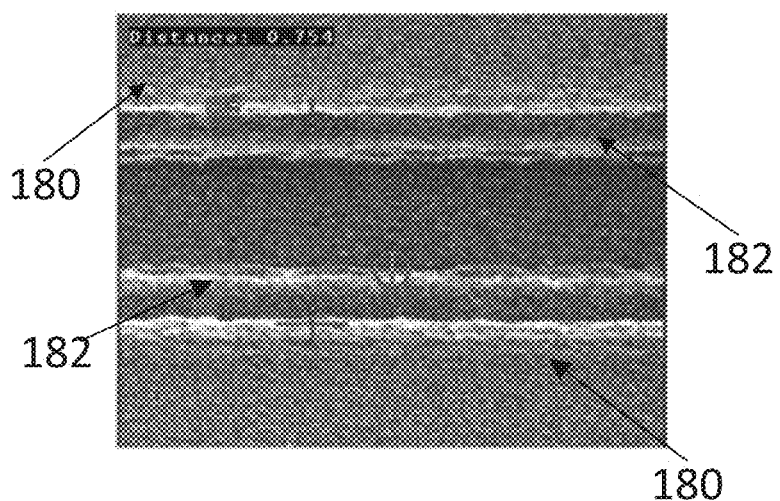
FIG. 1H shows a scanning electron microscope (SEM) image of a top view of two patterned layers of photoresists.
Figure 1I:
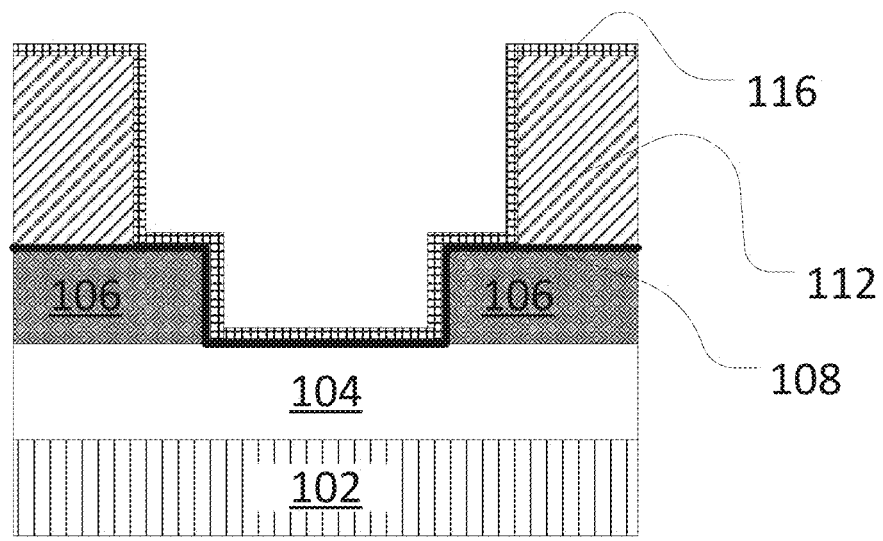
FIG. 1I shows a conformal passivation layer formed on the structure shown in FIG. 1G.
Figure 1J:
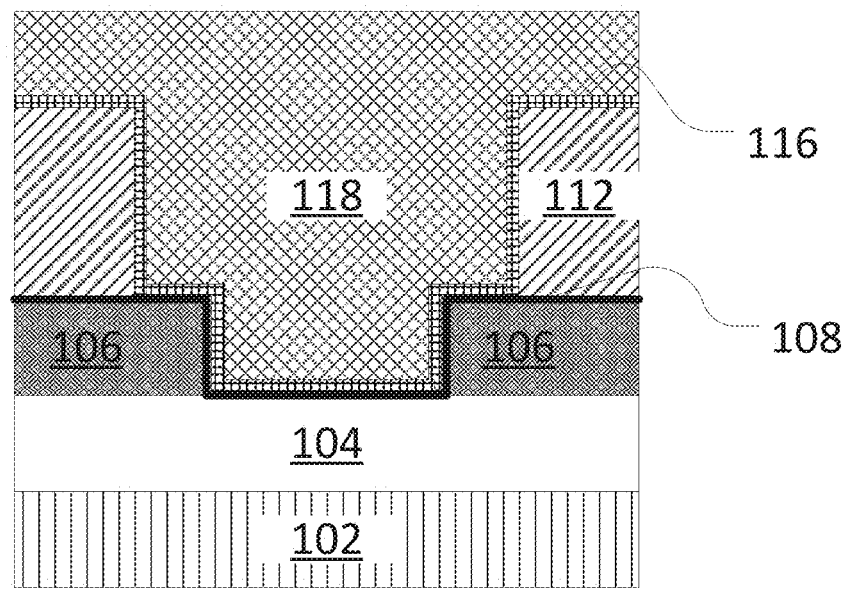
FIG. 1J shows a third photoresist filling in the opening shown in FIG. 1I.

FIG. 1H is a scanning electron microscope (SEM) image of a top view of the arrangement of a lower photoresist 182 having a smaller opening underneath an upper photoresist 180 having a larger opening. The white color regions at the edges of the photoresists 180 and 182 in FIG. 1H, may be due to rougher surfaces along these edges causing a stronger scattering or a larger emission of secondary electrons when viewed under SEM The passivation process can be repeated to introduce a third layer of photoresist 118, as shown in FIGS. 1I and 1J. As before, this photoresist layer can have the same thickness or a different thickness from one or more other photoresist layers. A second conformal passivation layer 116 is deposited using ALD directly on the patterned photoresist layer 112 before the third photoresist layer 118 is introduced into the spaces defined by the first and second openings 110 and 114, and directly on the second passivation layer 116. The process can be repeated for any number of photoresist layers to form an arbitrary 3D structure, as outlined schematically in FIGS. 1A-1C.

One example of a 3D structure that can be formed by a suitable combination of multiple layers of photoresist is a top-gate electrode of a FET. The FET can include a layer of nanomaterials such as CNT. The methods and systems described herein are compatible with photolithography based methods of fabricating FET having a layer of nanomaterial as the active channel material. In general, a FET includes a source electrode, a drain electrode and a gate electrode between the source electrode and the drain electrode. A voltage applied to the gate electrode controls whether a current passes, within the layer of nanomaterial, between the source electrode and the drain electrode.

Figure 1K:
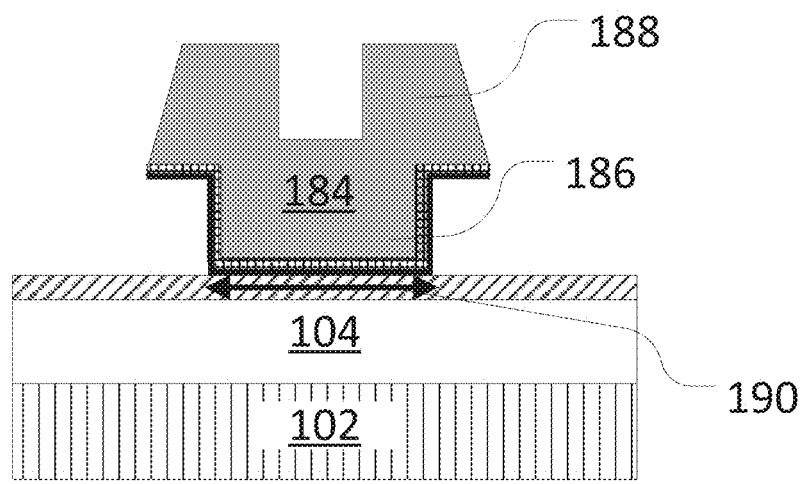
FIG. 1K shows a schematic diagram of a top-gate electrode.

A top-gate electrode 184 shown in FIG. 1K can be shaped to have a narrower foot portion 186 and a wider head portion 188, the foot portion 186 being connected directly to the head portion 188. The foot portion 186 can also be described as a stem having a height equal to the thickness of the first photoresist layer 106.

The shape of the top-gate electrode 184 resembles a T, and can be called a T-gate. Such a T-gate differs from a conventional electrode having a planar design and has two added benefits.

First, the small footprint of the foot portion 186 at the base of the T-shape electrode reduces a gate-length, marked with an arrow 190 in FIG. 1K. A reduced gate-length is beneficial for pushing the ballistic transport limit, increasing the transconductance (gm) and cutoff frequency (fT), and lowering the thermal noise. Transconductance, a contraction of transfer conductance, is the change in the current through a semiconductive channel that is due to changes in the applied gate voltage. Cutoff frequency is the frequency at which the current gain through the device is unity, or in other words, when the input current and output current are equal without any amplification or attenuation. Thermal noise is a component of electrical noise introduced inside a conductor due to thermal agitation of the charge carriers.

The wider head portion 188 of the T-gate preserves the large-overall cross-section of the electrode, which reduces the gate-resistance, (Rg), and also promotes a lower noise-figure. Gate resistance is the electrical resistance contributed by the gate-electrode. Noise figure is a figure of merit that quantifies the degradation of the signal to noise ratio through an radio-frequency circuit.

Figure 1L:
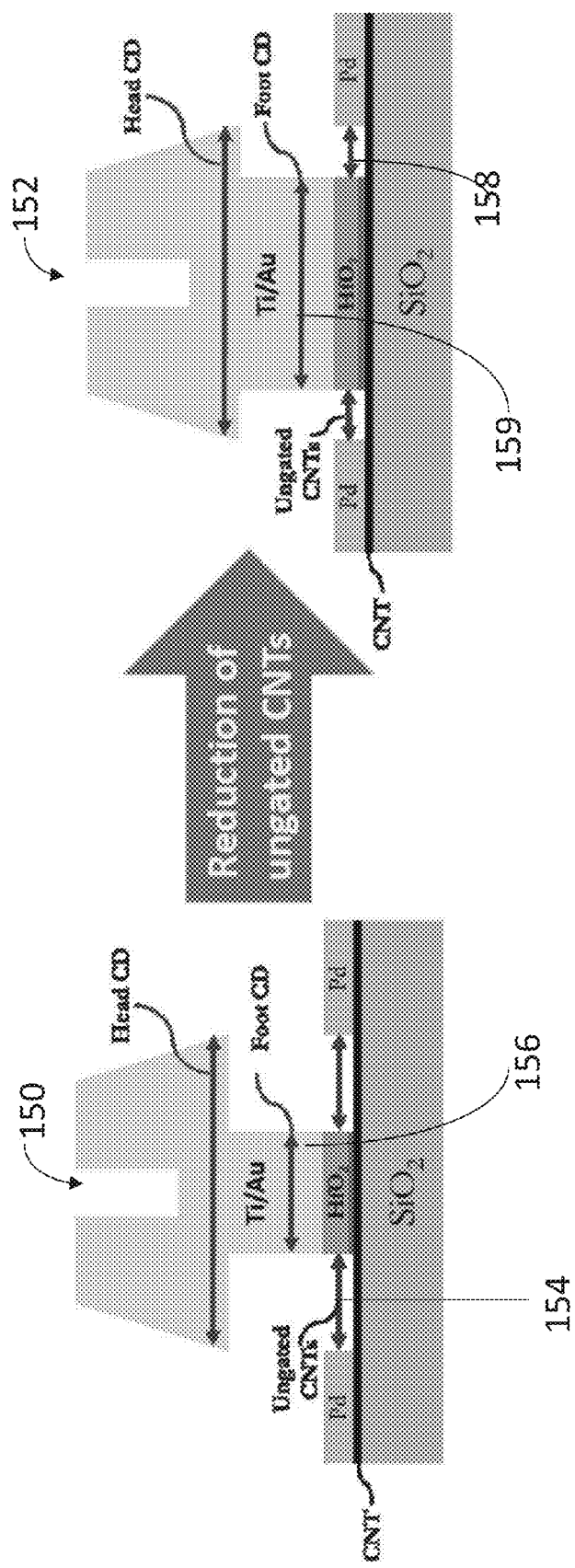
FIG. 1L shows top-gate electrodes having ungated portions of different dimensions.

Second, the T-gate electrode can serve as a mask and allows the source and drain electrodes to be self-aligned to the gate electrode. In other words, a metallic layer can be directly deposited on the layer of nanomaterial in the presence of the T-gate electrode (which serves as a shadow mask), so that the metallic layers forming the source electrode and the drain electrode are deposited in regions of the nanomaterial not blocked by the T-gate electrode. The source electrode and drain electrode formed in this fashion do not short each other because the shadowing provided by the T-gate electrode spatially separates the source electrode from the drain electrode. In this way, the ungated portion of the carbon nanotubes within a portion of the layer of nanomaterial between the source electrode and the drain electrode (i.e., the channel) can be minimized by a judicious choice of the dimensions of the head portion and the foot portion of the top gate electrode. For example, the critical dimension (CD) of the head portion of the top-gate electrode can be slightly larger than the CD of the foot portion. In this way, an ungated portion can be reduced by 50-70 nm on either side of the top-gate electrode. As shown in FIG. 1L, for a top-gate electrode 150 which has a smaller foot portion 156, there is a larger ungated portion 154 of the CNT. In contrast, for a top-gate electrode 152 having a larger foot portion 159, there is a smaller ungated portion 158 (compared to ungated portion 156). In other words, to minimize the ungated portion of the CNT, one could make the CD of the head portion slightly larger relative to the CD of the foot portion.

Scaling down to even smaller dimensions (particularly when the CD of the foot portion is less than 200 nm) can increase the gate resistance. The CD of the head portion of the top gate electrode may also shrink down proportionately. In general, the optimization of device dimension should be selected in an application specific manner.

Another feature of the CNT-FET is the presence of a layer of dielectric between the gate electrode and the layer of CNT. In FET where the layer of dielectric is formed by oxidation of the metal in the gate electrode, the material composition of the dielectric layer is constrained by the metal used for the gate electrode (i.e., the dielectric layer will be the metal oxide of the gate electrode). In addition, the thickness of the dielectric layer is self-limited by the extent of the oxidation on the surface of the metal electrode. In some embodiments, the oxidation of the metal in the gate electrode can be part of the same manufacturing process for the FET, or it can be conducted at a different facility than that used to manufacture the FET. For example, a first manufacturer may provide an intermediate CNT-FET without an intervening dielectric layer to a second manufacturer or an end user who then oxidizes the metal in the gate electrode. For example, when the gate electrode includes aluminum, the substrate or wafer of the intermediate CNT-FET can be placed on a hot-plate for 1 hour at an elevated temperature of, for example, 150° C., so that an outer surface of the aluminum oxidizes to yield about 2-3 nm thick layer of aluminum oxide, even in the portion under the gate electrode, above the nanomaterial. In some embodiments, the passivation layer disposed between a lower photoresist and an upper photoresist serves as the layer of dielectric between the gate electrode and the layer of CNT, no additional dielectric layer is deposited, and the gate metal is also not oxidized to yield a dielectric layer.

FIG. 1M demonstrates the advantages of using a passivation layer. FIG. 1M shows a structure 161 that includes a bottom layer 160 of photoresist, a thin and transparent passivation layer that is not visible from the image in FIG. 1M, and a top layer of the photoresist 165 deposited on a substrate 167. In some embodiments, a dimension of bottom layer 160 can define an air-bridge span (shown in FIGS. 3G, and 4A-4C. Due to the presence of a passivation layer, the bottom layer of the photoresist remains intact as shown in FIG. 1M even after the development of the top layer of photoresist. The structure 163 shown in FIG. 1N does not have a passivation layer between the bottom photoresist and the top photoresist. Due to the absence of a passivation layer, development of the top layer 162 of photoresist inadvertently removes all bottom photoresist that is not covered by the top photoresist, as shown in FIG. 1N.

The absence of a passivation layer can lead to difficulties in depositing a top photoresist layer that has a uniform layer thickness above a bottom photoresist layer. FIG. 1O compares optical images of a top layer of photoresist 170 applied on a lower photoresist without an intervening passivation layer between the photoresist layers, and a top layer of photoresist 172 applied on a passivation layer that is in turned applied on a lower photoresist. Different regions 164 and 166 of the photoresist 170 show different levels of shading in the optical image, indicating that the top layer of photoresist 170 has poor thickness uniformity across the surface of the substrate. In contrast, the more homogeneous shading shown in the optical image of top layer of photoresist 172 indicates a top photoresist layer 172 that has a more uniform thickness. Table 1 and Table 2 show thicknesses of the top layer of photoresist 170 and 172 at different locations of the wafers, respectively. As detailed below in Table 1, the top photoresist layer 170 has a 23% variation in thickness. Percentage variation in thickness is calculated as the difference between maximum thickness and minimum thickness across the wafer surface, divided by the average thickness×100%. In contrast, the thickness of top photoresist layer 172 has a thickness variation that is smaller than 1%.

TABLE 1

| Wafer Location | Thickness of top photoresist layer 170 [nm] |
|---|---|
| Top | 402 |
| Center | 387 |
| Bottom | 487 |
| Left | 425 |
| Right | 482 |

TABLE 2

| Wafer Location | Thickness of top photoresist layer 172 [nm] |
|---|---|
| Top | 453 |
| Center | 452 |
| Bottom | 453 |
| Left | 453 |
| Right | 453 |

The presence of a passivating layer having a thickness of 1 nm to 3 nm between a top and a bottom photoresist layer allows photoresists having uniform layer thicknesses to be deposited above a bottom photoresist layer. It was not previously appreciated that applying a passivation layer between layers of photoresists could allow a top photoresist having high thickness uniformity to be deposited above a lower layer of photoresist. Moreover, it was not previously contemplated for a passivating layer to be deposited between photoresist layers that are subsequently removed in a liftoff process. Moreover, it was not been previously contemplated that a thickness uniformity of a top photoresist layer deposited above a bottom layer, which can be patterned without the use of etching, can be improved. A bottom layer that can be patterned without the use of a dry-etch process such as oxygen plasma is compatible for use with an underlying nanomaterial layer that may become degraded in the process of dry-etch. An example of such a bottom layer is a photoresist layer, which can be patterned using photoresist chemical strip solutions. In general, methods that involve exposing a photoresist layer to plasma conditions to harden the photoresist layer may not be compatible for use with a photoresist layer having an underlying nanomaterial layer. In addition, exposing a photoresist to plasma conditions may also inadvertently etch a portion of the photoresist (e.g., the bottom photoresist, which can widen dimensions of an opening used to form the foot portion of a top-gate electrode).

FIGS. 2A-2I illustrate techniques for fabricating a CNT-FET. The techniques include using ALD to deposit a layer of dielectric between the gate electrode and the layer of CNT. The use of ALD allows the choice of the material for the dielectric layer to be independent of the choice of the material for the gate metal. The thickness of the dielectric layer can also be precisely controlled using ALD.

Figure 2A:
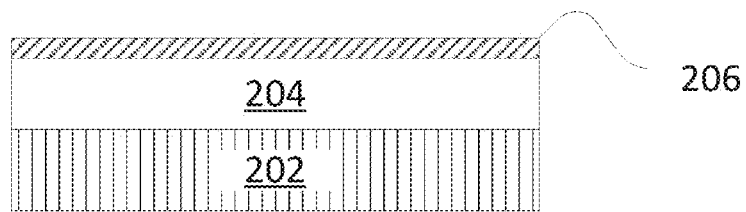
FIG. 2A shows a layer of nanomaterial deposited on a substrate.

FIG. 2A shows a substrate 202 which can have an oxide layer 204 formed thereon. In some embodiments, the substrate 202 can be silicon, while the oxide layer 204 is a thermal silicon dioxide layer formed on the top surface of the substrate 202. A layer of nanomaterial 206 is directly deposited on the oxide layer 204. In some embodiments, the nanomaterial 206 can be CNT, or SWNT having a thickness of between 1 nm and 2 nm. When the nanomaterial 206 is CNT (e.g., SWNT), the CNT can be mixed in a solution of water and surfactant. The solution containing CNT is left on a wafer for a few hours before the wafer is rinsed. The water can contain 1% (w/v) of surfactant to suspend the CNTs in solution. The CNT can also be polymer wrapped and suspended in a toluene or chloroform solvent, before being deposited on the substrate. Thereafter, a photoresist can be spun on the CNT. Alternatively, instead of CNT being added as part of the same manufacturing process, the CNT can be received from a third party already disposed on the substrate. In addition to CNT, the layer of nanomaterial 206 can be one or more layers of graphene.

Figure 2B:
FIG. 2B shows electrodes formed on the nanomaterial shown in FIG. 2A.
Figure 2C:
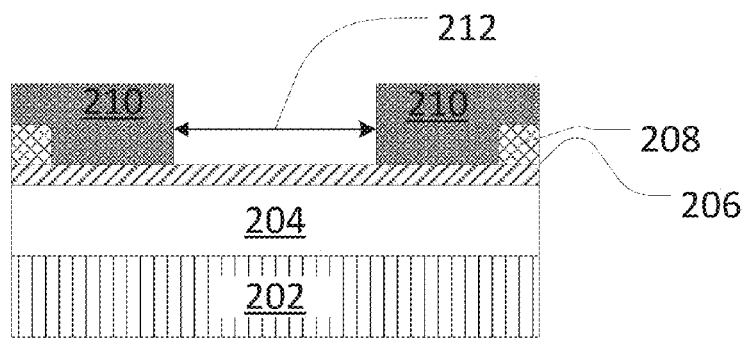
FIG. 2C shows photoresists covering the electrodes shown in FIG. 2B.

FIG. 2B shows two electrodes 208 deposited directly on the layer of nanomaterial 206 formed by coating the surface with a negative photoresist, mask or blocking the central portion from UV light exposure. The patterned photoresist is then developed, and a metal layer, such as Ti/Au, is then vapor deposited before liftoff to reveal the patterned electrode 208. A layer of photoresist 210 is then applied directly on the electrodes 208, and an opening 212 is defined using photolithography in the layer of photoresist 210, as shown in FIG. 2C. An example of a photoresist is ULTRA i123-0.35 from Dow Chemicals of Midland, Mich. In some embodiments, the layer of photoresist 210 can have a thickness of between 200 nm to 600 nm, for example, 300 nm. The width of the opening 212 is related to the dimension of the foot portion 186 of the top gate electrode 184, as shown in FIG. 1K (or the foot portion 228 of the top gate electrode 226, as shown in FIG. 2I). For example, the opening 212 can be patterned using an ASML 5500-200 i-line stepper from ASML of Eindhoven, Netherlands, having a realizable critical dimension (CD) down to 300 nm.

Figure 2D:
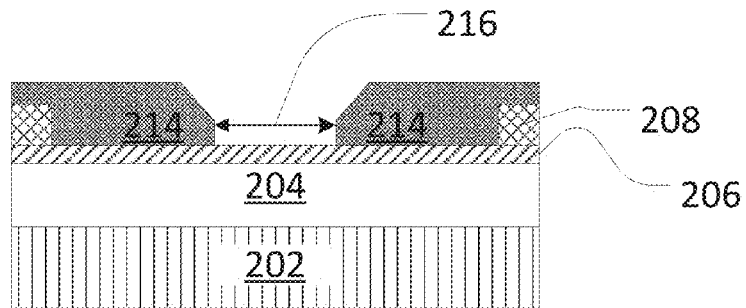
FIG. 2D shows an opening of the photoresist shown in FIG. 2C being reduced.
Figure 2E:
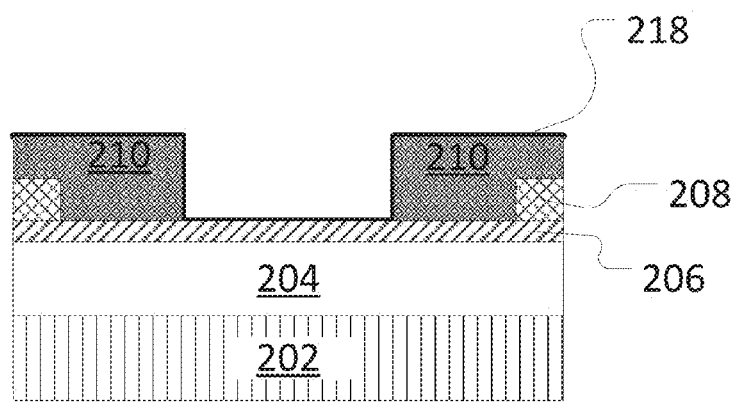
FIG. 2E shows a chemical shrink layer being deposited on a photoresist.
Figure 2F:
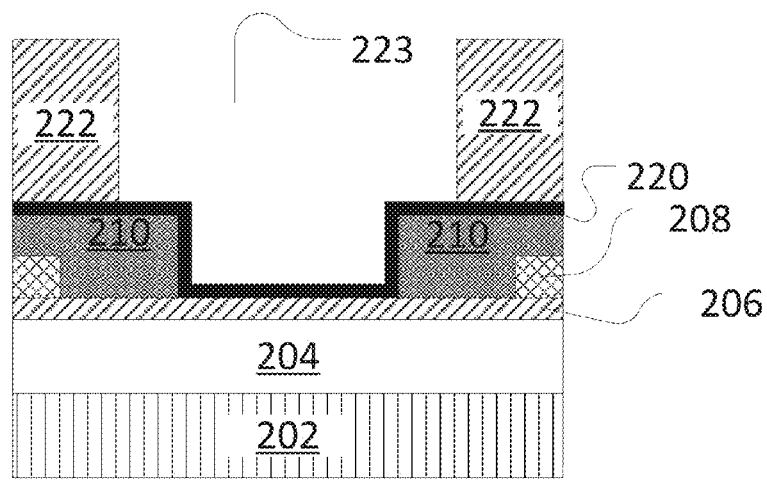
FIG. 2F shows a second photoresist formed on the structure shown in FIG. 2C.
Figure 2G:
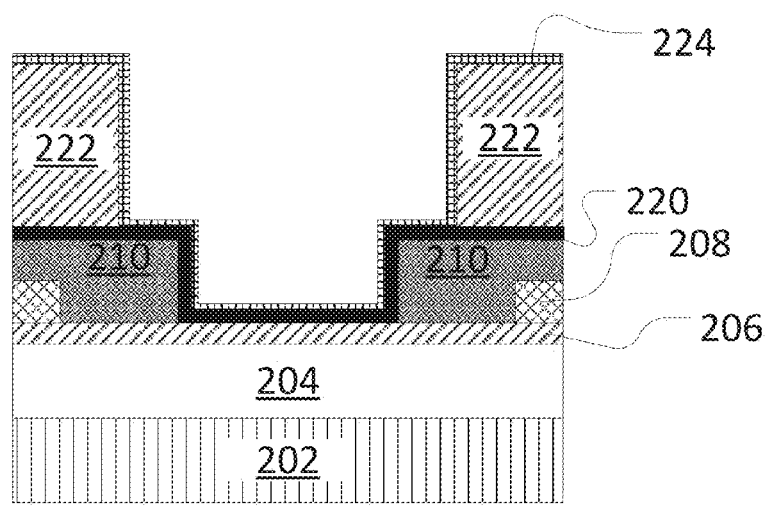
FIG. 2G shows a dielectric layer formed on the structure shown in FIG. 2F.

In some embodiments, as shown in FIG. 2D, the layer of photoresist 210 can be reflowed to reduce a dimension of the opening defined in the layer of reflowed photoresist 214, thereby reducing a dimension of the foot portion 186 of the top gate electrode. For example, the opening 216 in FIG. 2D is smaller (as shown by the double headed arrow in the opening) than the opening 212 in FIG. 2C. Reflowing the photoresist involves baking the photoresist at a temperature higher than normally used for the post-exposure bake with the express purpose of softening and ultimately rounding or reflowing the developed photoresist structures such that it spreads into the opening 212. In some embodiments, as shown in FIG. 2E, a chemical shrink formulation 218, also known as resolution enhanced lithography assisted by chemical shrink (RELACS), can be applied directly on the layer of photoresist 210, or be applied to the layer of photoresist after the reflowing process illustrated in FIG. 2D has occurred, to further reduce the size of the opening 214. The chemical shrink formulation, can for example, be from AZ-R607 from AZ Electronic Materials of Branchburg, N.J. The chemical shrink can form an additional organic layer on a side wall of the photoresist when the chemical shrink undergoes a cross-linking reaction with acids components in the photoresist. The chemical shrink can then be baked to allow chemical reactions involving acid diffusion before the chemical shrink is developed and rinsed.

In general, the solvent for the chemical shrink can be water, which has little influence on the patterned resist. Chemical shrinks such as RELACS, can include water-soluble polymer and other water soluble additives. The layer of chemical shrink formulation is generally not found to be sufficient to passivate a bottom layer of a positive photoresist, such as ULTRAi123-0.35 from Dow Chemical, of Midland, Mich.

Similar to the technique outlined in FIGS. 1A-1G a conformal passivation layer 220 is deposited directly on the first layer of photoresist 210, using ALD. For example, 1-5 nm of $Al_2O_3$ or $HfO_2$ can be deposited as passivation layer 220. In some embodiments, 1.5 nm of $Al_2O_3$ is deposited as a passivation layer using ALD at 90° C. The passivation layer provides a good surface for a second layer of photoresist 222 to be applied directly on (i.e., applied by spin coating) the top surface (e.g., the entire top surface) of the passivation layer 220. In some embodiments, the same photoresist material is used for the first layer of photoresist 210 and the second layer of photoresist 222. In some embodiments, different materials can be used, for example, the first layer of photoresist 210 can be positive photoresist, and the second layer of photoresist 222 can be a negative photoresist.

The second layer of photoresist 222 can have a thickness of between 300 nm to 900 nm, for example, between 400 nm to 500 nm. In general, the thickness of the second layer of photoresist 222 is kept to a thickness that reduces (e.g., prevents) the amount of vapor deposited metal adhering to sidewalls of the second layer of photoresist 222, contiguous to a second opening 223 defined using photolithography in the second layer of photoresist 222. The width of the opening 223 determines a width of the head portion 230 (shown in FIG. 2I). The presence of the passivation layer 220 ensures that any developed pattern in the lower first layer of photoresist 210 is not modified (e.g., eroded) by the solvents and developer used to create the opening 223, or any other pattern in the second layer of photoresist 222. In other words, the developed pattern in the lower first layer of photoresist 210 can remain substantially constant while forming the opening 223, or any other pattern, in the second layer of photoresist 222. Remaining substantially constant can mean having less than a 0.5% decrease in volume of the patterned photoresist layer 210 upon the formation of an opening in the second photoresist layer 222. The passivation layer 220 also allows the second layer of photoresist 222 to form a good, uniform coat above the first layer of photoresist 210.

After the opening 223 has been defined in the second layer of photoresist 222, a conformal dielectric layer 224 is applied using thermal ALD. Thermal ALD uses thermal heat as the activation energy to allow the reactions to happen while Plasma ALD uses energy of the plasma to facilitate activate the reaction. For example, $HfO_2$ can be deposited at a thickness of 5 nm-10 nm to form a high-k dielectric layer using low-temperature (90° C.) thermal-ALD. In general, ALD is carried out at a temperature below the threshold temperature where reflow in the photoresist occurs, for example, ALD is carried out at temperatures below 120° C. Reflowing may make the removal of the photoresist layers at liftoff more difficult. For a photoresist like ULTRAi-123-0.35 from Dow Chemical, of Midland, Mich., the ALD can be conducted at a temperature of about 90° C.

The use of ALD to deposit dielectric layer 224 helps to decouple the choice of the dielectric material from the choice of the gate metal. In addition, the thickness of the dielectric layer 224 can be independently tuned. In some embodiments, ALD is not used to deposit a conformal dielectric layer. Instead, the dielectric layer is provided by the thermal oxidation of the gate metal in a gate electrode 226 (shown in FIG. 2H). In this case, the thickness of the oxide layer is self-limiting and not independently controlled, unlike ALD. In some embodiments, where the passivation layer 220 and the dielectric layer 224 are of different materials (e.g., a passivation layer 220 that includes $Al_2O_3$ and a dielectric layer 224 that includes $HfO_2$), regions of the passivation layer 220 not covered by the second layer of photoresist 222 can be etched away before the dielectric layer 224 is deposited using ALD. In that case, the dielectric layer 224 would be a conformal dielectric layer that is directly deposited on the second photoresist layer and above the first layer of photoresist. In such cases, a $HfO_2$ layer is not formed directly on a $Al_2O_3$ layer, and contamination at the interface between the two materials, at the interface can be reduced (e.g., eliminated). In some embodiments, the passivation layer 220 includes $HfO_2$ and the dielectric layer 224 also includes $HfO_2$, such that an interface between two different materials does not form where the passivation layer 220 contacts the dielectric layer. When the passivation layer 220 not covered by the second layer of photoresist 222 is not etched away before the dielectric layer 224 is deposited using ALD, the conformal dielectric layer is deposited directly on the second photoresist layer and the conformal passivation layer.

Figure 2H:
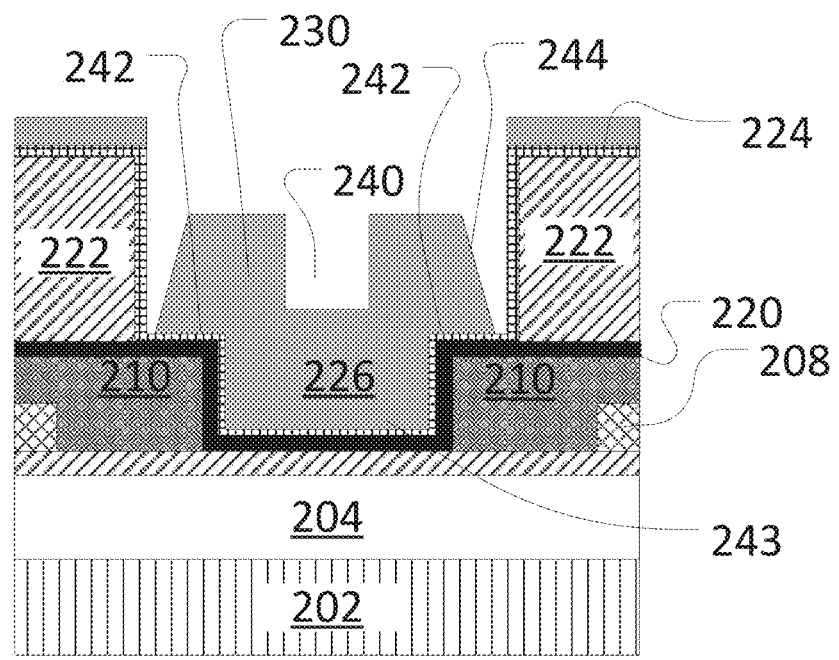
FIG. 2H shows a metal layer deposited directly on the structure shown in FIG. 2G.
Figure 2I:
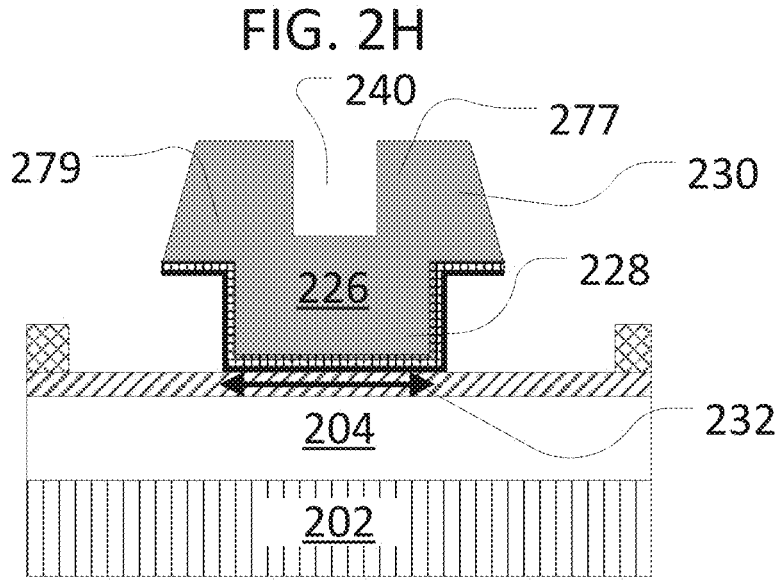
FIG. 2I shows a top-gate electrode formed after a liftoff process.

In FIG. 2H, metal is deposited directly on the ALD dielectric layer 224 to form the top gate electrode 226. The deposited metal fills the space defined by the openings 212 and 223. A notch 240 in the top gate electrode 226 results from the deposition of metal directly above the wings 242 formed by the photoresist layer 210, which are higher than a bottom portion 243 of the opening 212 by at least the thickness of the photoresist layer 210 which can have, for example, a thickness of 300 nm. The sloped sides 244 of the head portion 230 are caused by the spinning of the substrate 202 during metal deposition and the directional nature of the metal deposition. Examples of metals suitable for forming the T-gate electrode include Ti, Cr, Cu, Ag, Au, and a combination thereof. The metal can be deposited by Electron Beam Physical Vapor Deposition or EBPVD, or e-beam deposition. EBPVD is a form of physical vapor deposition in which a target anode containing the metal (e.g., Ti or Au, to be deposited) is bombarded with an electron beam given off by a charged tungsten filament under high vacuum. In some embodiments, 50-100 nm (e.g., 70 nm) of Ti, and 250-350 nm (e.g., 280 nm) of Au is deposited where the Ti serves as an adhesion layer.

The fabrication of the T-gate electrode 226 is completed after a liftoff process is used to remove all the photoresist from the structure, as shown in FIG. 2I. A PR strip solution AZ 300T from AZ Electronic Materials of Branchburg, N.J., can for example, be used to perform the liftoff. Despite the thickness of the metal and the conformal coating of the PR layer 210 and PR layer 222, liftoff occurs relatively easily in a PR strip solution (e.g., AZ 300T from AZ Electronic Materials of Branchburg, N.J.).

Figure 2K:
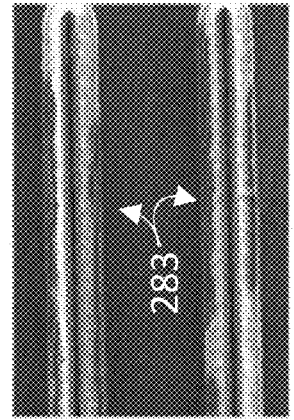
FIG. 2K shows an SEM image of a top view of two portions of a top-gate electrode.
Figure 2J:
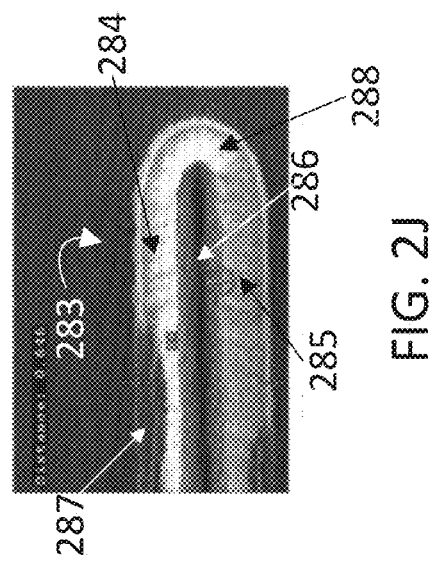
FIG. 2J shows an SEM image of a top view of a top-gate electrode.

FIG. 2J shows a SEM image of a top view of a T-shaped top gate electrode 283. The first head portion 284 (corresponding to either a left head portion 279 or a right head portion 277 shown in FIG. 2I) is separated by a trench 286 (corresponds to the notch 240 in FIG. 2I) from the second head portion 285. A round segment 288 is a fabrication artifact that occurs at ends of the top-gate electrode. Some darken regions 287 on the head portions are likely caused by ALD deposition of dielectric material, and these depositions are not detrimental to the structure or function of the top-gate electrode. The ALD deposition of dielectric material on the side of the T-gate head, as depicted in FIGS. 2J, 2K, may have originated from dielectric material that had previously been ALD deposited on the side-walls of the top-photoresist. Such ALD deposited dielectric material may then attach and be subsequently transferred, perhaps by a Van der Waals force, to the sides of the head portion of the top-gate electrode during liftoff. FIG. 2K shows two portions of a top-gate electrode 283. The images shown in FIGS. 2J and K are taken from a short-loop process that only involved the T-gates and no CNT or other electrodes are present. The dark region underneath the T top gate electrode 283 in FIGS. 2J and 2K is the substrate. The dark middle portion in each portion of the top-gate electrode 283 is the trench 286 as labeled in FIG. 2J.

Figure 2L:
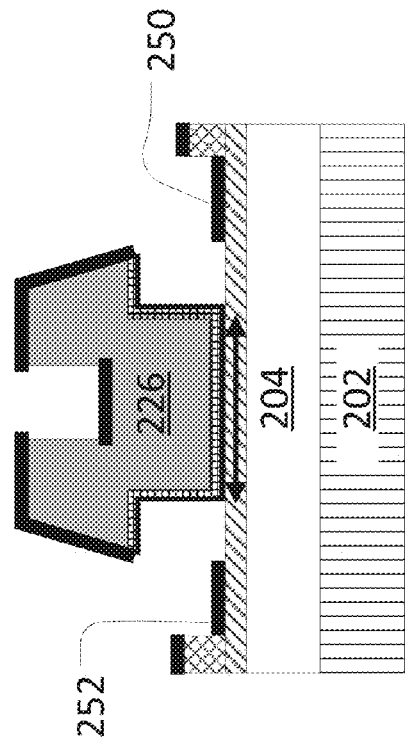
FIG. 2L shows self-aligned electrodes formed using the top-gate electrode shown in FIG. 2I as a shadow mask.
Figure 2M:
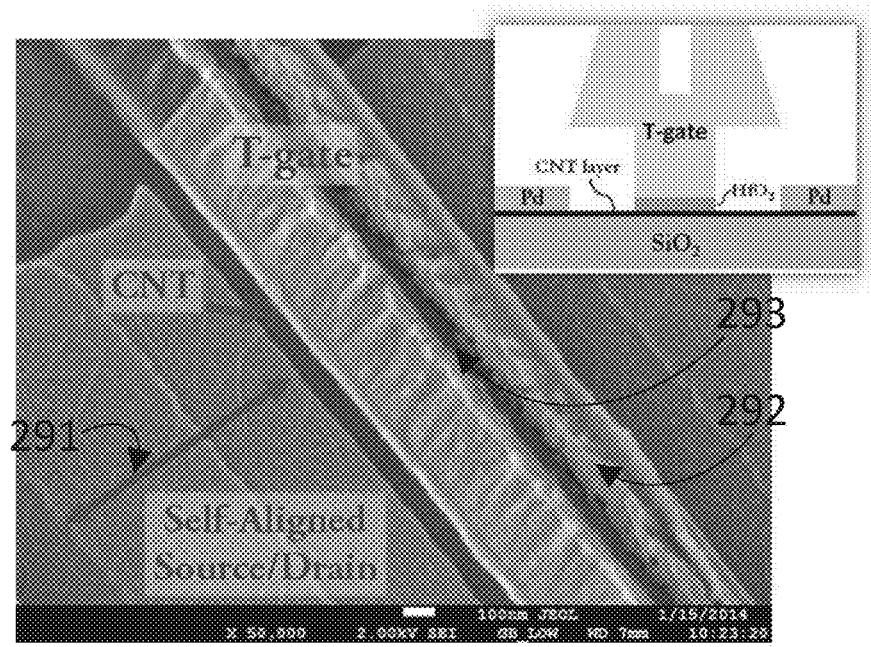
FIG. 2M shows an SEM image of a top view of a transistor.

After the T-gate electrode 226 is fabricated, another deposition of metal can be carried out as shown in FIG. 2L to deposit self-aligned source and drain electrodes 250 and 252 while the head portion 230 serves as a shadow mask. FIG. 2M shows an SEM top view image of a portion of a FET, specifically a self-aligned source or drain metal layer 291 that serves as an electrode and a T-gate electrode. Underneath the source or drain metal layer 291 is SWNT. The T-gate electrode 292 also has a trench 293. The SEM is recorded at an angle of 22° relative to the vertical axis. The inset is a schematic cross-section view of the T-gate electrode and the self-aligned source/drain electrode. HfO$_2$ is shown as the dielectric layer in the schematic diagram in the inset. The FET shown in FIG. 2M can be fabricated using six lithography steps, three metal vapor deposition (i.e., evaporation) steps, two ALD deposition steps and one oxygen plasma etch step.

The process begins with lithographically patterning the CNT, followed by removing unwanted portions of CNT using oxygen plasma etching, and then a second lithographic step to pattern source/drain electrodes. Thereafter, metal vapor deposition is used to create the source/drain electrodes. A third lithographic step is used to pattern the lower PR layer for the top gate electrode before a passivation layer is deposited using ALD. A fourth lithographic step is used to pattern the upper PR layer for the top gate electrode before a dielectric layer is deposited in a second ALD step. A fifth lithographic step is used to pattern a co-planar waveguide before a second metal vapor deposition step is used to thicken the co-planar waveguide. A coplanar waveguide is a type of electrical transmission line used to convey microwave signals that can be readily fabricated with photolithography. A sixth lithographic step is used to pattern the self-aligned source/drain electrode before a third metal vapor deposition/evaporation step is used to deposit metal for the self-aligned source-drain electrode. The sixth lithographic step produces the self-aligned source/drain electrode which is closer to the gate than the source/drain electrodes produced in the second lithography step. Evaporating the self-aligned S/D metal without patterning (via the sixth lithographic step) may result in shorting of the coplanar waveguides electrode pads because shadow mask provide by the head portion of the top gate electrode may only protect the portion of the gate within the channel.

Figure 2N:
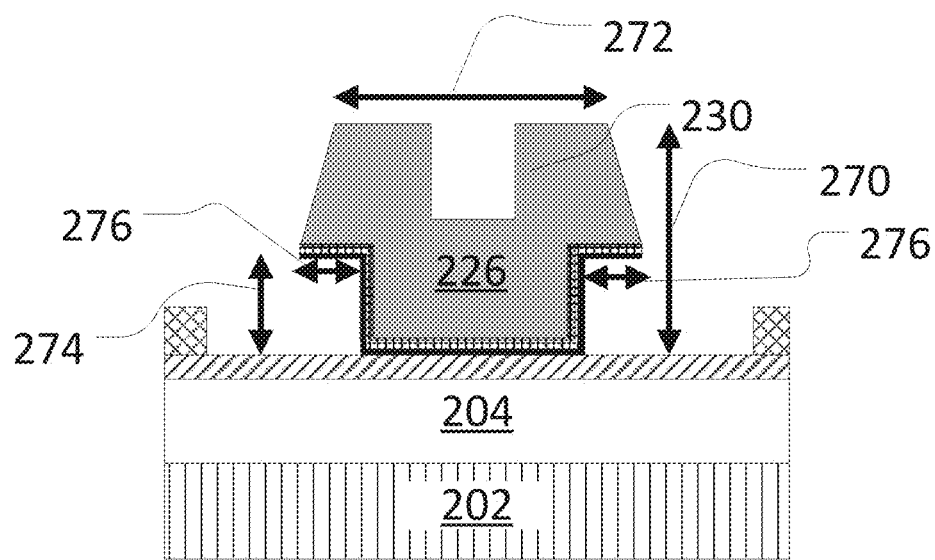
FIG. 2N shows a top-gate electrode.

FIG. 2N shows exemplary dimensions of the top-gate electrodes formed by the techniques illustrated in FIGS. 2A-2I. A width 272 of the head portion 230 can be between 300-800 nm, while a height 274 of the foot portion 228 can be between 200-500 nm, for example, 300 nm. The total height 270 of the top-gate electrode can be between 500-1000 nm, for example, 700 nm. A width of the widest sloped side 276 of the head portion 230 can be between 70 to 150 nm.

Figure 2O:
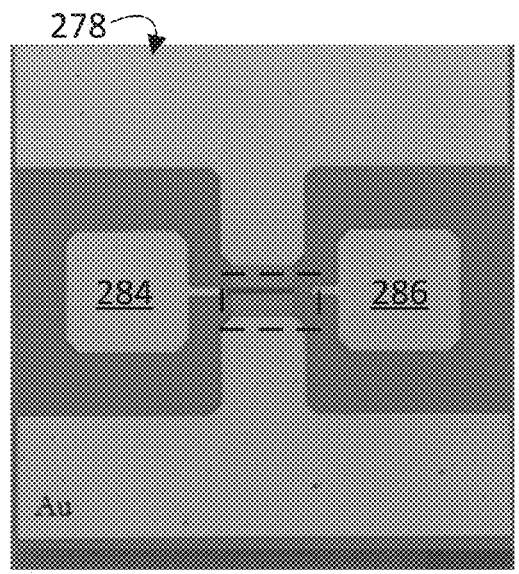
FIG. 2O shows an optical image of a transistor.
Figure 2P:
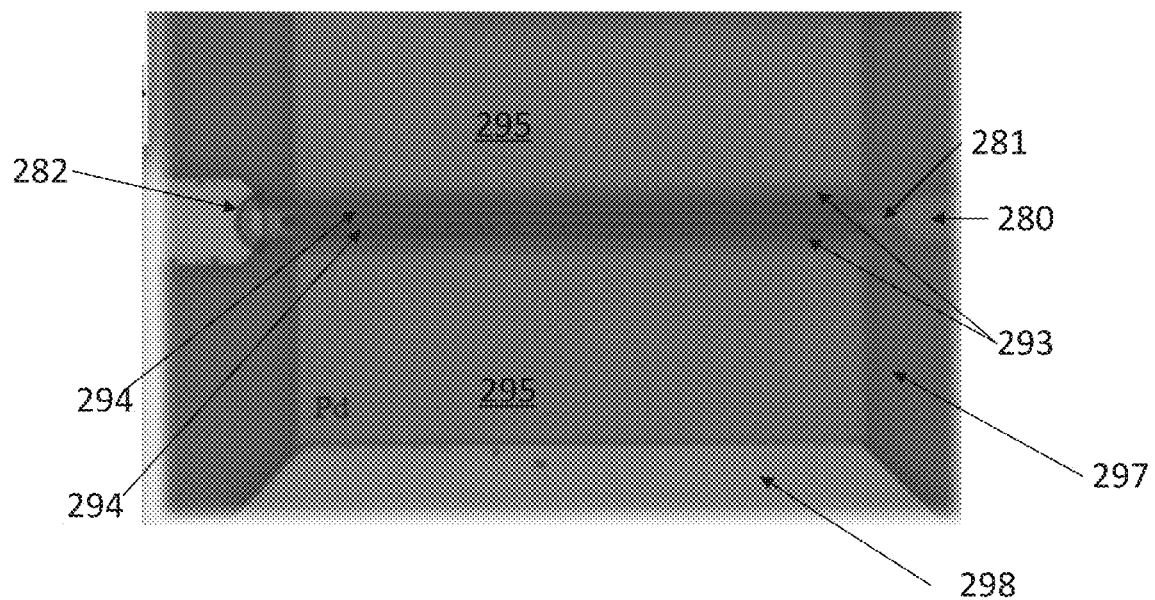
FIG. 2P shows an optical image of a transistor.

FIG. 2O shows an optical image of a CNT-FET 278 in a coplanar waveguide configuration having a probe contact pad 284 for the gate electrode and a probe contact pad 286 for the drain electrode FIG. 2P is a magnified image of the dashed rectangular portion demarcated in FIG. 2O. The CNT 293 is deposited in a rectangular region around the top-gate electrode 294 on top of a substrate 297. A drain electrode finger 281 of the drain electrode 280 is disposed between the two fingers of the top-gate electrode 294. A rounded portion 282 is the pad for another electrode to contact to the top-gate electrode 294. The source electrodes 295 are separated by the CNT 293 and top-gate electrodes 294. The source electrodes 295 are formed from palladium. A Ti/Au metal layer 298 from the coplanar waveguides contacts the source electrodes 295. The metal layer 298 is a thickening of the source electrodes 295. Abrupt changes in the height profile of the metal for RF applications can be reduced by stepping down the height profile at the probe contact pads from 300 nm, to 40 nm, to 10 nm, to the CNT. At the same time, the metal contacting the CNTs can be kept sufficiently thin to avoid unnecessary parasitic capacitance while the metal on the probe contact points are sufficiently thick to allow for repeated contacts to be made to it.

Figure 2Q:
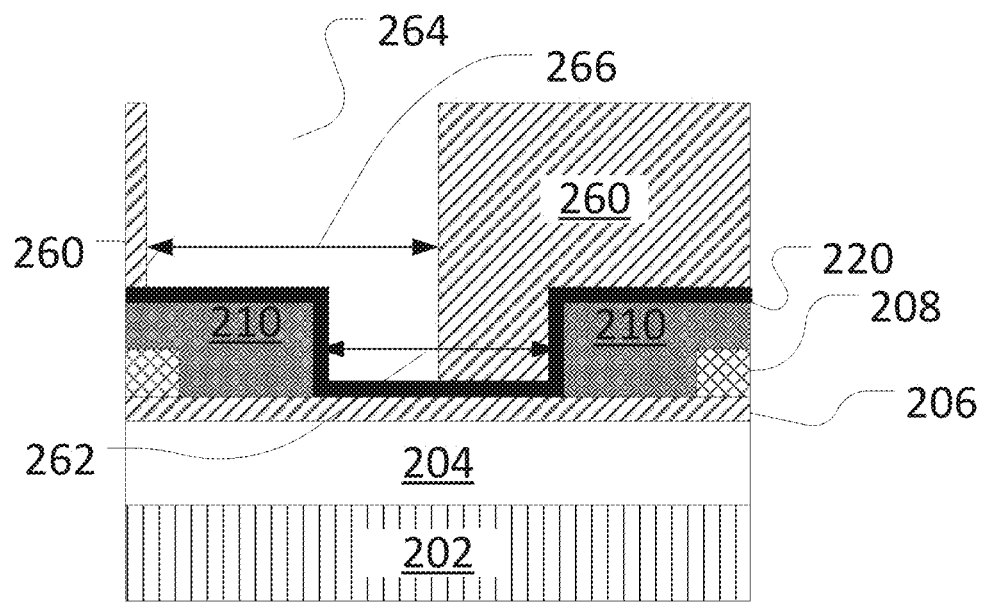
FIG. 2Q shows an asymmetric arrangement of photoresists.

In addition to symmetrical top-gate structures, asymmetric top-gate structures can also be fabricated using photolithography. An example of such an asymmetric top-gate can be formed using an asymmetric pattern of photoresists shown in FIG. 2Q. A first opening formed in the first photoresist layer 210 can have a width 262 that corresponds to the minimum feature size that can be exposed using a particular photolithographic tool. For example, an opening defined using ASML 5500-200 i-line stepper from ASML of Eindhoven, Netherlands, can have a width 262 that is as small as 300 nm.

Figure 2R:
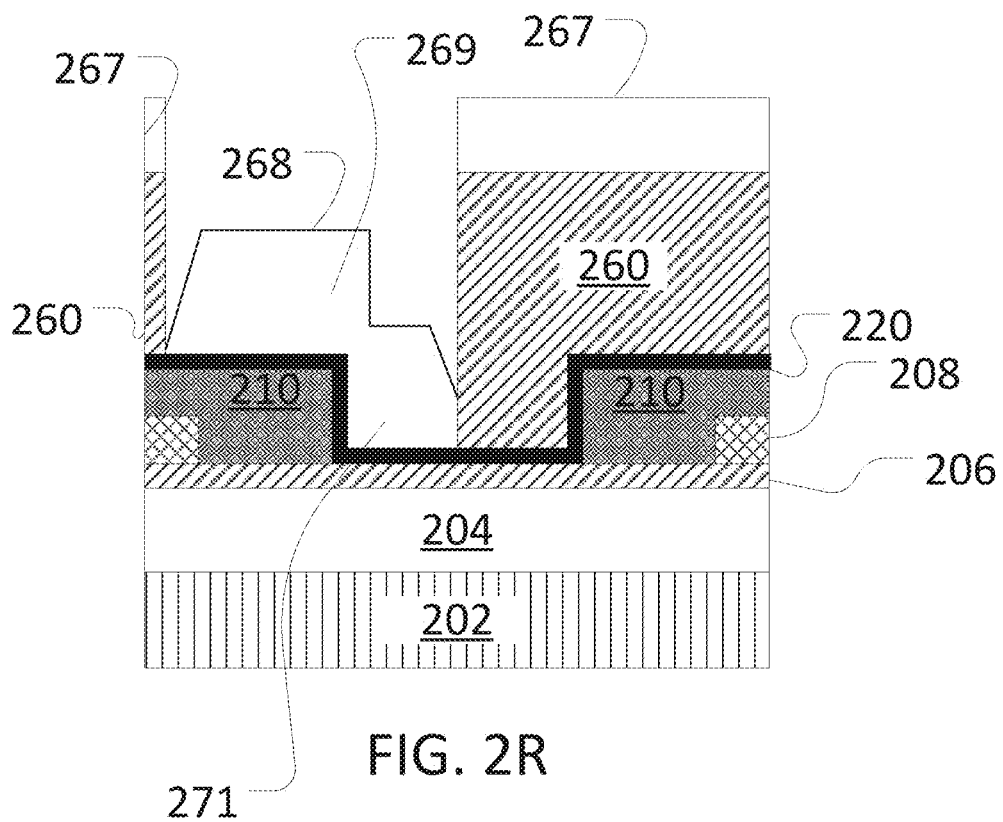
FIG. 2R shows an asymmetric top-gate electrode.

A second photoresist 260 is disposed above the first photoresist layer 210 as previously described but a mid-point in a second opening 264 formed in the second photoresist 260 is offset from a mid-point in the first opening. As shown in FIG. 2R, a layer of metal 267 is deposited both in the second opening 264 and above the second photoresist 260 as previously described with respect to the symmetric top-gate structure. The portion of the metal 267 deposited within the opening 264 forms the top-gate electrode 268. Here a top-gate structure having a foot portion 271 that is equal to or smaller than half the minimum feature size of the exposure apparatus can be formed by providing a suitable offset between the mid-points in the first and second photoresists. A size of the second opening 264 can be chosen such that the head portion 269 is still sufficiently large to decrease the gate-resistance of the top-gate electrode 268, while not being too large such that structural stability of the top-gate structure 268 is compromised.

Transistors can be configured as multifinger devices. Multifinger devices refer to devices that have multiple elongated portions of a particular electrode (e.g., a drain electrode) maintained at the same electrical potential. A transistor having a multifinger design allows for large effective device widths without having to use long fingers. Device width is the dimension perpendicular to the length of the long fingers. A multifinger device divides a single long finger into multiple fingers. Power amplifiers may use a larger overall gate-width to produce a larger current. In addition, fingers having gate widths that are less than $\lambda/80$, where $\lambda$ is the wavelength of the applied signal, may avoid loss and phase-angle shifts along the width of the gate-finger. Thus, dividing a long single gate finger into a multifinger gate can allow higher currents to be obtained and reduces phase-delays along the gate finger. Doing away with the long fingers can thus help to circumvent issues relating to phase-angle shifts in microwave and millimeter wave operation as the electrical signal propagates down the length of the long gate finger and the associated signal loss associated with long fingers.

In general, it is challenging and may even be topographically impossible for three electrically independent electrodes each having two or more fingers to interdigitate on a two dimension planar wafer surface. Interdigitating the electrodes can include arranging the source, gate, drain electrodes in an alternating repeating arrangement of source electrode-gate electrode-drain electrode-gate electrode.

Air-bridges fabricated using the methods and systems disclosed herein can allow one conductor to span over another without electrically shorting the two conductors. For example, one conductor can be an inductor or it may be an electrode of a transistor (e.g., gate electrode, source electrode, drain electrode).

The methods and systems disclosed in FIGS. 3A-3G can allow the simultaneous fabrication of air-bridges and top-gate electrodes in multifinger gate transistors, simplifying the overall fabrication process to save both time and money.

Figure 3A:
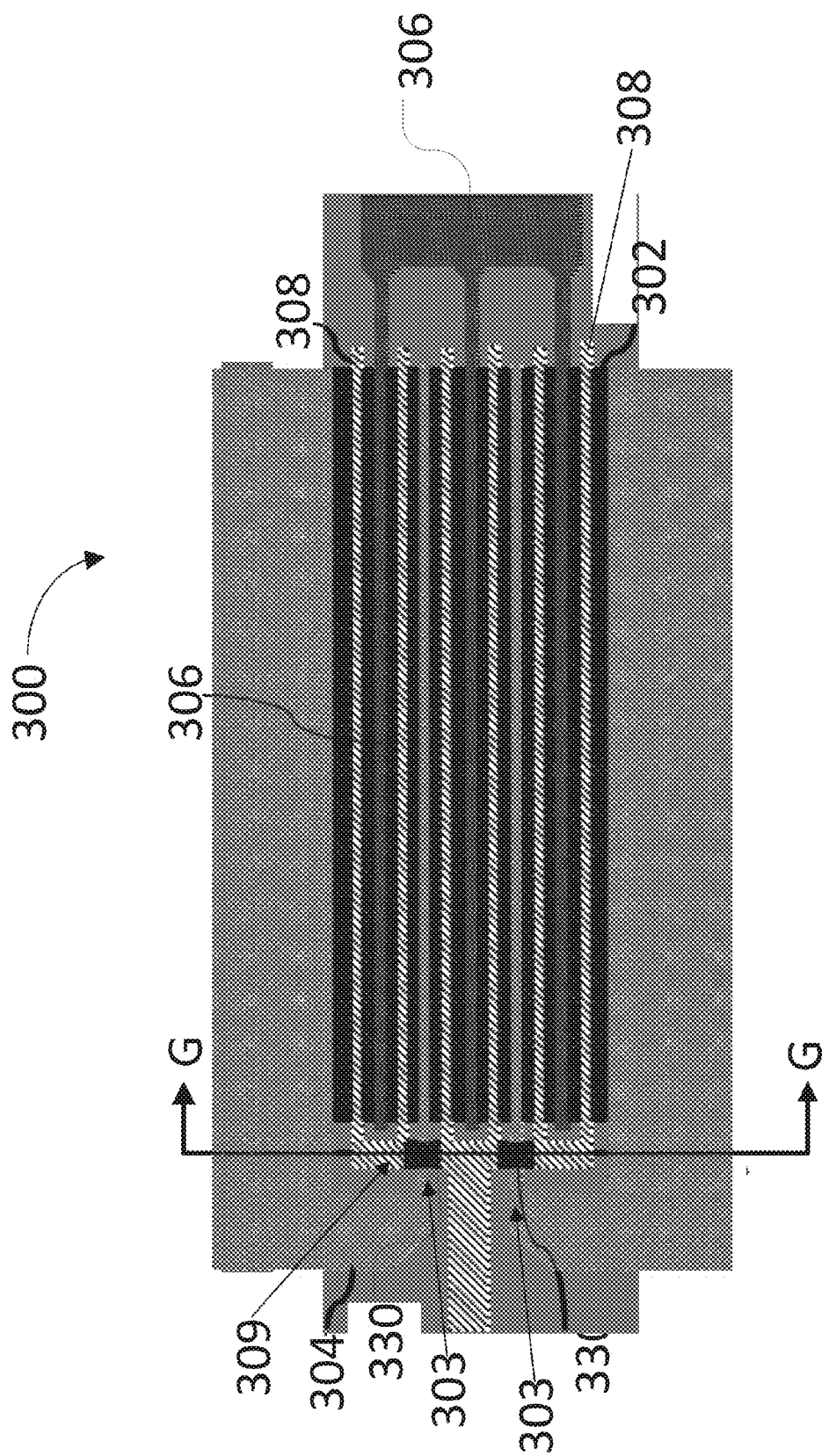
FIG. 3A shows a top view of a transistor having multifinger electrodes.

FIG. 3A shows a top view of a multifinger transistor 300. A nanomaterial layer 302 is deposited above a substrate (not shown) and a source electrode 304 is deposited above the nanomaterial layer 302. Portions of the source electrode 304 lie outside the region of the nanomaterial layer 302. The source electrode includes two rectangular portions that sandwich the nanomaterial layer 302 and two narrower portions 303 that extend between the two rectangular portions. A drain electrode 306 arranged in a comb configuration is also deposited on the nanomaterial layer 302. Air-bridges 330 and a top-gate electrode 308 can be fabricated simultaneously, and may therefore, have the same thickness. The source electrode 304, the drain electrode 306 and the top-gate electrode 308 are interdigitated such that a portion of the top-gate electrode 308 is arranged between a portion of the source electrode 304 and a portion of the drain electrode 306. Portions of the top-gate electrode 308 can be connected pairwise by a connecting segment 309. The connecting segment 309 is deposited directly on the substrate, and not on the layer of nanomaterial 302. The air-bridges 330 electrically connect pairs of portions of the top-gate electrode by spanning over underlying narrower portions 303 of the source electrode 304. A schematic cross-sectional view of the multifinger device along the line marked G is shown in FIG. 3G.

Figure 3B:
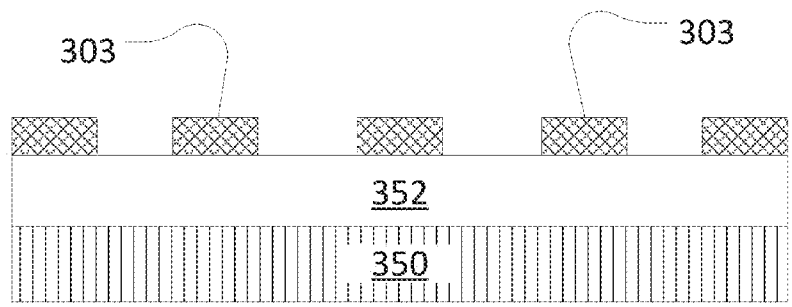
FIG. 3B shows a pattern of electrodes.
Figure 3C:
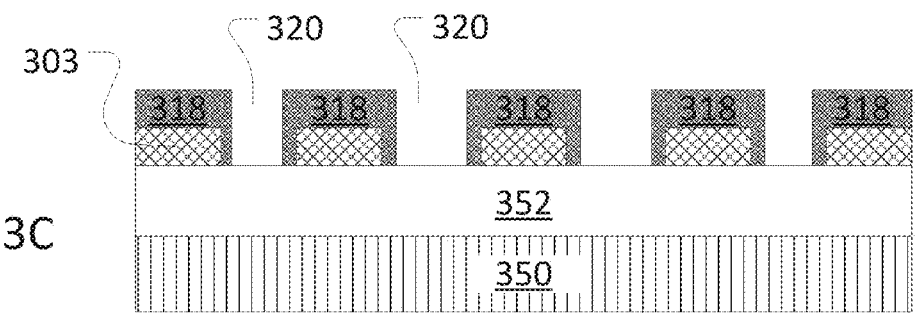
FIG. 3C shows a pattern of photoresists formed directly on the pattern of electrodes shown in FIG. 3B.
Figure 3D:
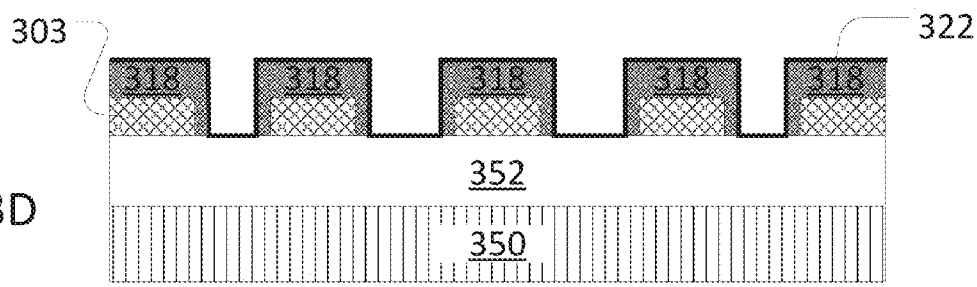
FIG. 3D shows a passivation layer formed directly on the structure shown in FIG. 3C.
Figure 3E:
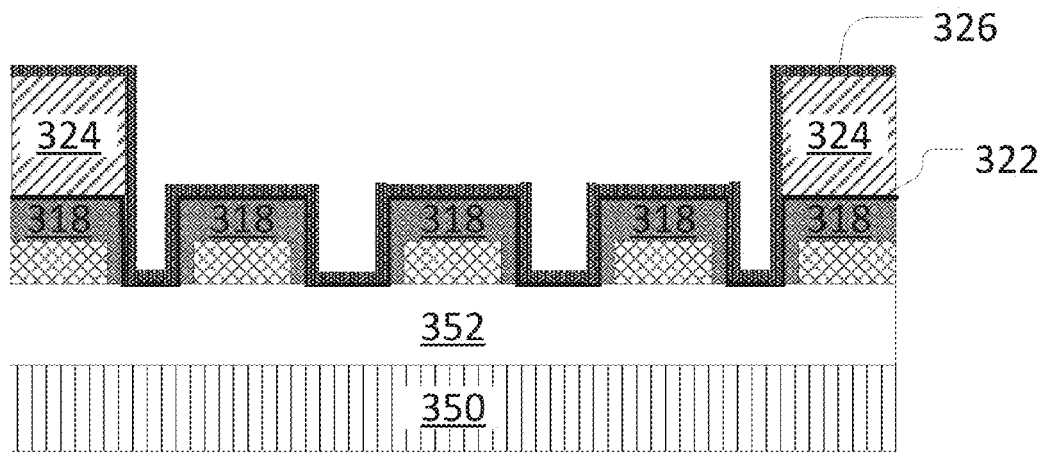
FIG. 3E shows a second photoresist formed directly on the structure shown in FIG. 3D.
Figure 3F:
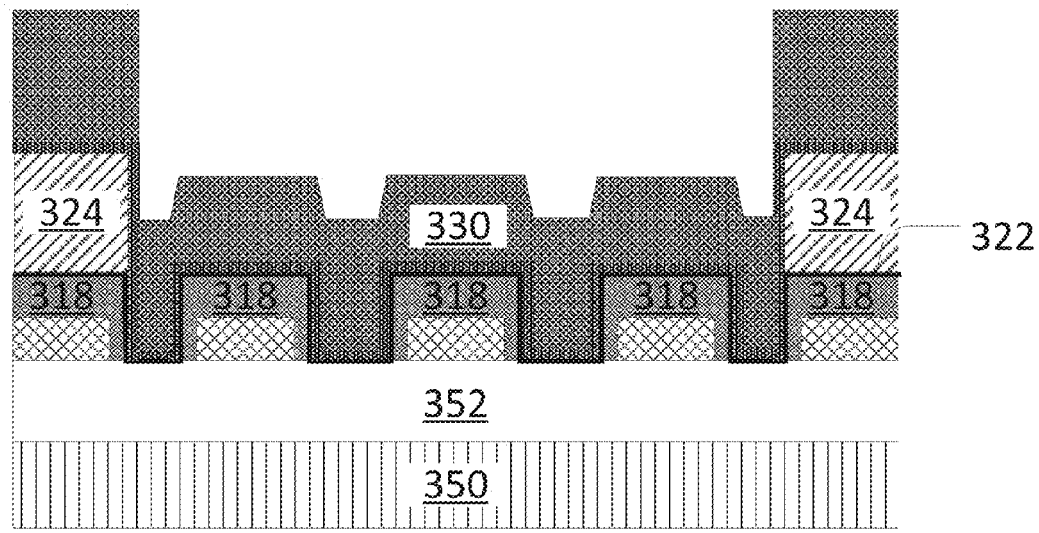
FIG. 3F shows a layer of metal deposited on the structure shown in FIG. 3E.
Figure 3G:
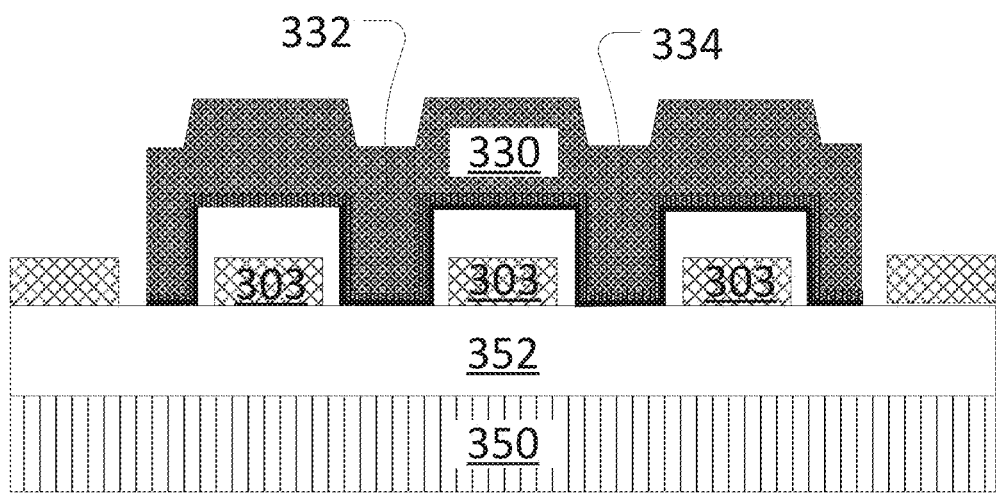
FIG. 3G shows air-bridges formed after a liftoff process.

FIGS. 3B-3G illustrate the fabrication of air-bridges 330. FIG. 3B shows an optional oxide layer 352 on a top surface of substrate 350. The substrate 350 can be a silicon wafer and the oxide layer 352 can be a 1.5 µm thick layer of $SiO_2$ thermal oxide. Even though a layer of nanomaterial 302 is deposited above the oxide layer 352, the layer of nanomaterial 302 does not appear in FIGS. 3B-3G because the cross sectional view depicted in these figures are taken along the line marked G in FIG. 3A where the layer of nanomaterial 302 does not extend. A number of narrower portions 303 of source electrode 304 are deposited using photolithography techniques above the oxide layer 352. For illustration purposes (that do not accurately reflect the number of electrodes in FIG. 3A), five narrow portions 303 of the source electrode 304 are shown in FIGS. 3B-3G. A first photoresist layer 318 is applied directly on the narrow portions 303 and on the oxide layer 352 (and also directly on the nanomaterial layer 302 in other regions of the substrate). The photoresist layer 318 is patterned to define openings 320 using photolithography techniques described in detail in FIGS. 1A-1C, and FIGS. 2A-2C. The thickness of the first photoresist layer 318 may be, for example, between 100-300 nm, for example, 300 nm. The photoresist can be ULTRAi123-0.35 from Dow Chemical, of Midland, Mich. Thereafter, as shown in FIG. 3D, a conformal passivation layer 322 is applied directly on the photoresist layer 318 using ALD. The thickness of the passivation layer 322 can be between 1-5 nm, for example, 1-3 nm. The passivation layer 322 can be, for example, $Al_2O_3$, or $HfO_2$. The passivation layer 322 helps to stabilize the first photoresist 318 to allow another photoresist layer to be coated smoothly thereon. The passivation layer also helps to prevent a developer solution used to define and form openings in an overlying photoresist from eroding the pattern formed in the lower photoresist 318.

Subsequently, a second layer of photoresist 324 (shown in FIG. 3E) is applied directly on the passivation layer 322. A second opening is defined in the photoresist 324 using photolithography techniques before a conformal dielectric layer 326 is applied directly on the second photoresist 324 using ALD. The second photoresist 324 may be the same photoresist as the first layer of photoresist 318, and a thickness of the second photoresist 324 may be between 300-700 nm, for example, between 400-500 nm. As shown, the photoresist layer 318 and the second photoresist 324 can have different thicknesses. For example, the second photoresist 324 can have a thickness of 450 nm-500 nm. The conformal dielectric layer 326 is deposited by thermal ALD at a temperature of 90° C. The deposition temperature is kept below a temperature of, for example, 120° C., to reduce (e.g., prevent) reflowing of the photoresist layer 318 and second photoresist 324, which can make the removal of the photoresists during liftoff more difficult. In some embodiments, the conformal dielectric layer 326 is omitted.

As shown in FIG. 3F, metal is deposited into the openings defined by the first photoresist 318 and the second photoresist 324 to form an air-bridge 330. The metal can include Ti, Au, or a combination thereof and be applied using electron beam metal vapor deposition (i.e., evaporation), similar to that described in reference to FIGS. 2H and 2I.

Thereafter, as shown in FIG. 3G, the photoresist 318 and 324 are removed in a liftoff process using, for example, photoresist strip solution AZ-300T, from AZ Electronic Materials of Branchburg, N.J. The air-bridge 330 spans and bridges over the narrow portion 303 of the source electrode 304. A first end of the air-bridge 330 is connected to the metallic portion 332, while the other end of the air-bridge 330 is connected to the metallic portion 334. As the metallic portion 332, the metallic portion 334 and the air-bridge 330 are formed simultaneously during a single vapor-deposition process, thicknesses of the metallic portion 332, metallic portion 334, and the air-bridge 330 can be substantially equal. Substantially equal thicknesses of these three elements can be, for example, thicknesses that are within 5% of the average thickness of these three elements. The metallic portions 332 and 334 can extend into the plane of the drawing and take a different cross-sectional shape, for example, a T-shaped top-gate electrode as shown in FIG. 2I. Such a T-shaped top-gate electrode can be formed by appropriately patterning portions of the first photoresist 318 and the second photoresist 324 that extend into the plane of the drawing. In other words, while an air-bridge 330 is formed in the cross-sectional plane marked by the line G in FIG. 3A, T-shaped top-gate can be simultaneously formed in another part (i.e., the part that extends into the plane of the drawing of FIG. 3G) of the substrate 350. Thus, instead of fabricating top gate electrodes using one set of process steps and fabricating the air-bridges in a subsequent set of process steps, both can be accomplished simultaneously.

For illustration purposes to highlight the air-bridges 330, the connecting segments 309 shown in FIG. 3A are not depicted in the cross-sectional view of FIGS. 3B-3G. The connecting segment 309 is deposited directly on the oxide layer 352. Using the techniques disclosed herein, the thickness of the metal deposited for the air-bridges can be between 200 nm-800 nm (e.g., 400 nm), which is at least 10 times smaller than the thickness of the air-bridges formed using other techniques.

Figure 4B:
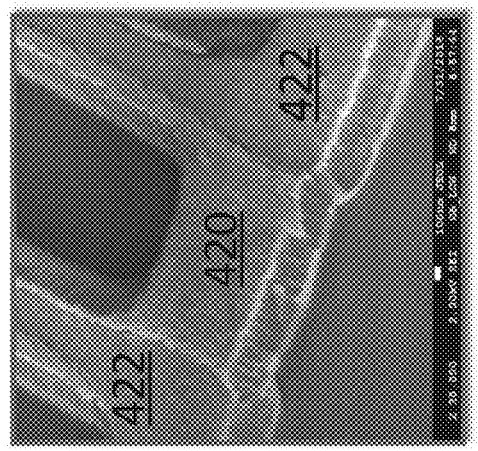
FIG. 4B shows a magnified SEM image of an air-bridge.
Figure 4C:
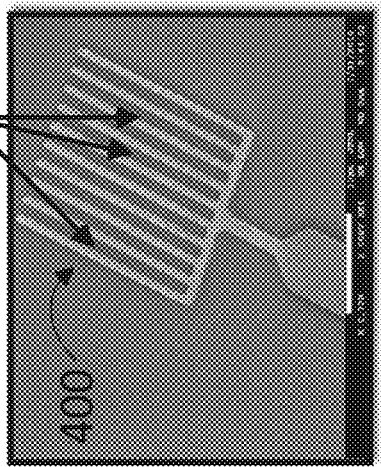
FIG. 4C shows an SEM image of multifinger electrodes.
Figure 4A:
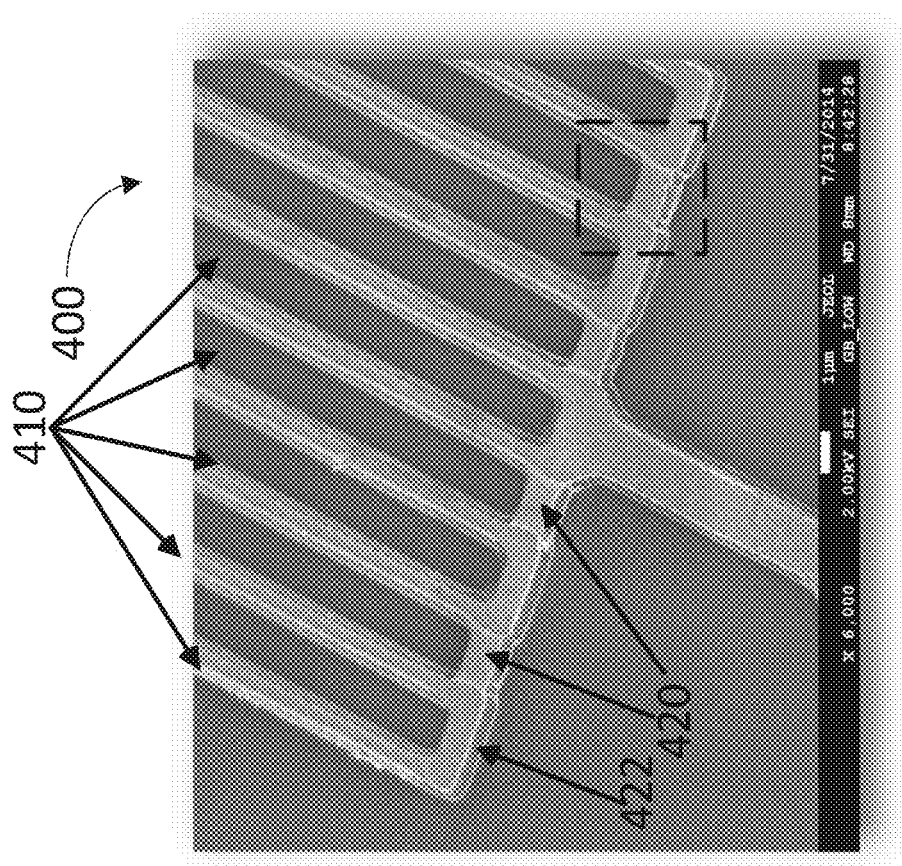
FIG. 4A shows an SEM image of air-bridges.

FIG. 4A shows a scanning electron microscope (SEM) images of structure 400 that includes a number of portions of a top-gate electrode 410 and air-bridges 420 that connect pairs of the portions of the top-gate electrode. Each pair of the portions of the top-gate electrode 410 is joined by connecting segments 422. FIG. 4B is a higher resolution zoomed-in image of the lower right portion of the structure. FIG. 4C is a lower resolution zoomed-out image of the structure 400 having the multifingered electrode.

As shown in FIGS. 2A-2I, fabrication of the top-gate CNT-FET can involve adhering the top-gate electrode, via a dielectric layer (i.e., the top-gate dielectric layer), to a layer of CNT. The layer of CNT can sometimes be blanket networks of CNT directly applied on the substrate within the confines of the channel region (i.e., the region between the source electrode and drain electrode). The techniques illustrated in FIGS. 5B-5E can improve the adhesion of the top-gate dielectric and metal to the underlying nanomaterial layer (e.g., CNT) and substrate. If the CNT network is sufficiently dense, for example, 10 tubes/µm, or a gate length of the top-gate electrode is sufficiently small, for example, less than 500 nm, adhesion of the top-gate dielectric and the top-gate to the nanomaterial can become challenging. In such a case, further downstream processing can cause the top-gate to be detached (e.g., uprooted) from its intended location between the source electrode and drain electrode. A gate length can be a width of the foot portion of a T-shaped top gate electrode.

Figure 5A:
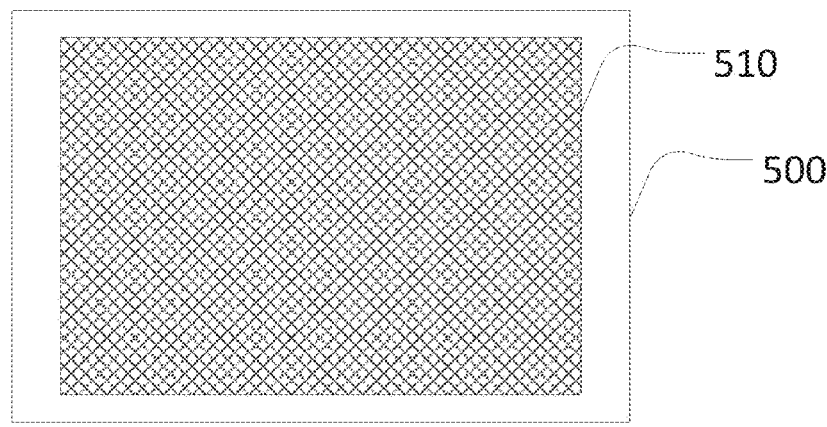
FIG. 5A shows a layer of nanomaterial deposited on a substrate.

FIGS. 5A-5E describe methods and systems for improving the adhesion of the gate-dielectric layer and the top-gate to the substrate. FIG. 5A shows a substrate 500 having a layer of nanomaterial 510 deposited thereon. The substrate 500 can have an optional oxide layer 504 deposited on a top surface. The nanomaterial can be CNT, and the substrate can be silicon (with or without a thermal oxide layer thereon). Alternatively, instead of CNT being added as part of the same manufacturing process, the CNT can be received from a third party already disposed on the substrate. In addition to CNT, the layer of nanomaterial 510 can be one or more layers of graphene.

Figure 5B:
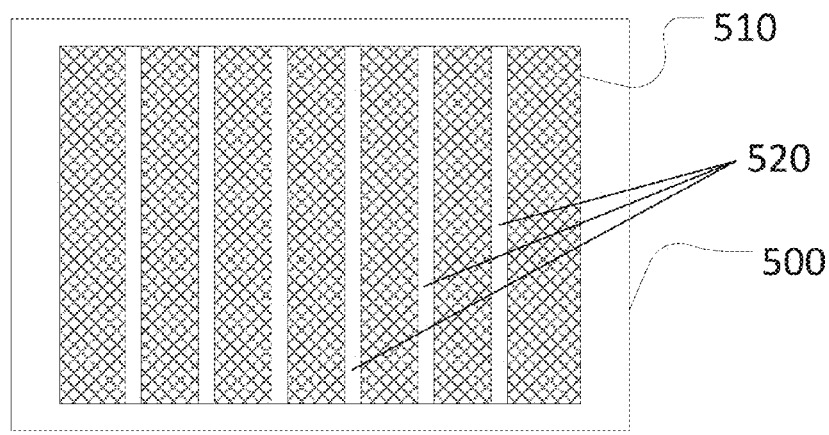
FIG. 5B shows a pattern of anchor points formed in the layer of nanomaterial.

FIG. 5B shows a pattern of anchor points 520, arranged as a series of parallel lines. A width of each of the parallel lines may be 0.1-2 µm. In general, the pattern of void regions can be oriented from the source-electrode to the drain-electrode. These anchor points are regions that are substantially void of nanomaterials (e.g., completely free of nanomaterial). The anchor points are generated by first covering areas of the nanomaterial layer that should not be etched with a patterned photoresist masking material. The masking material can be, for example, a negative photoresist, nLOF5510 before applying an oxygen plasma etch to remove all nanomaterials from regions that are not covered by the masking material which is subsequently removed using acetone or a photoresist strip solution such as AZ300T.

Figure 5C:
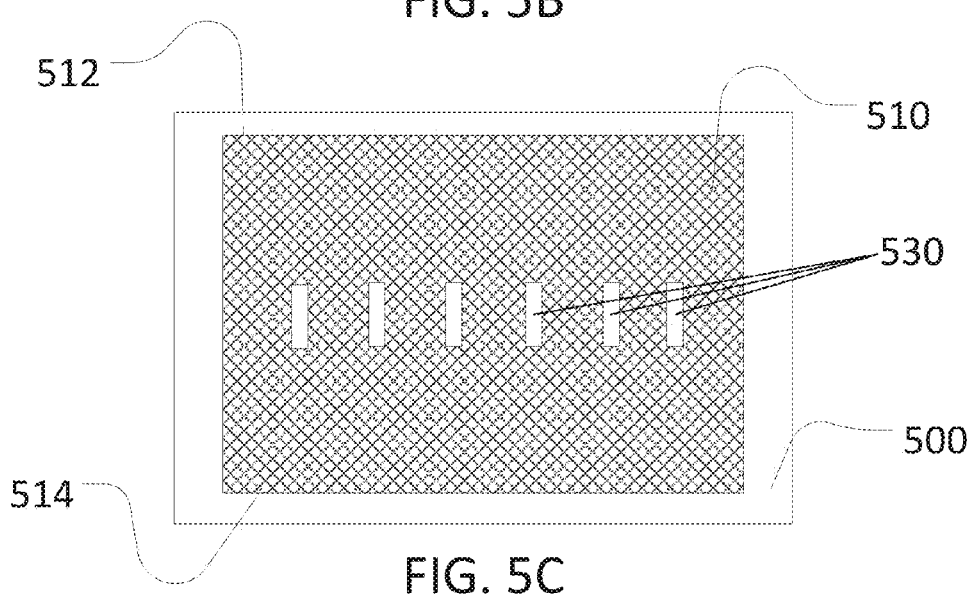
FIG. 5C shows a pattern of anchor points formed in the layer of nanomaterial.

Alternatively, as shown in FIG. 5C, only portions 530 of the region between a top edge 512 and a bottom edge 514 of the layer of nanomaterial 510 can be removed, instead of removing nanomaterials along an entire line perpendicular to both the top edge 512 and bottom edge 514.

Figure 5D:
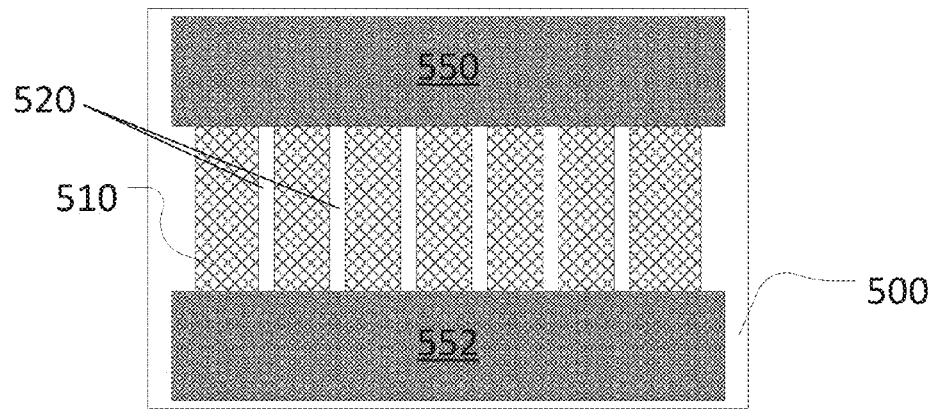
FIG. 5D shows a source electrode and a drain electrode formed on the structure shown in FIG. 5B.
Figure 5E:
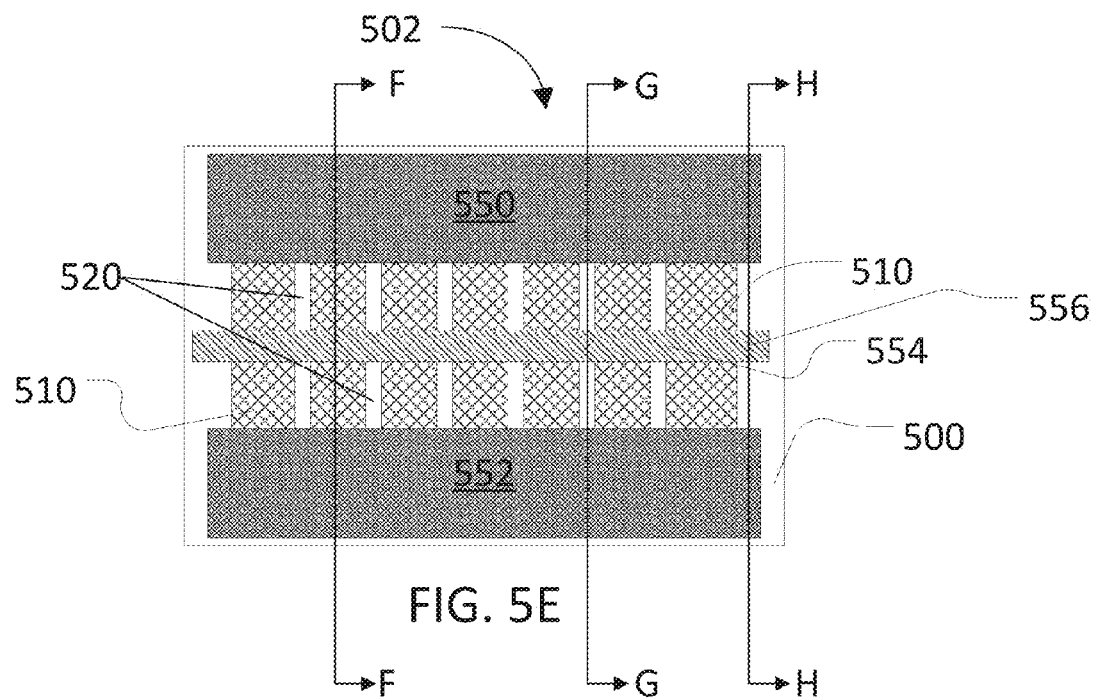
FIG. 5E shows a top gate electrode formed on the structure shown in FIG. 5D.
Figure 5F:
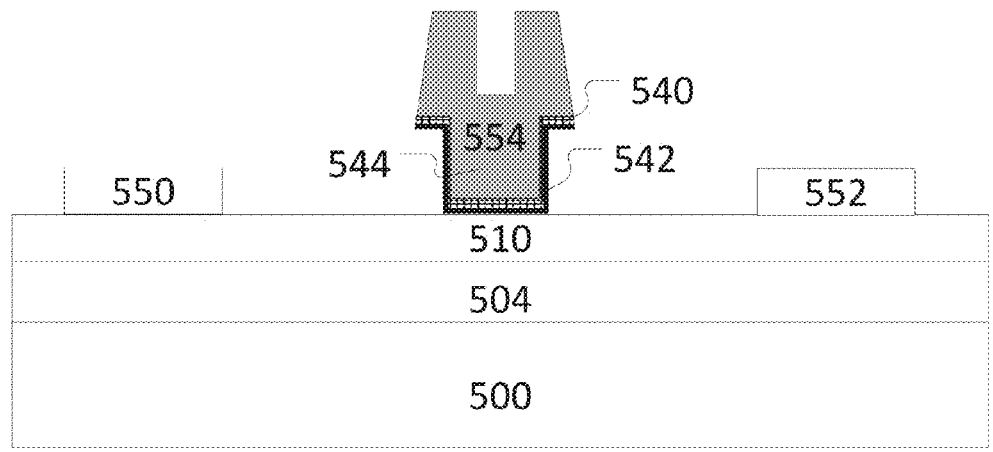
FIG. 5F shows a cross sectional view of the structure shown in FIG. 5E.
Figure 5G:
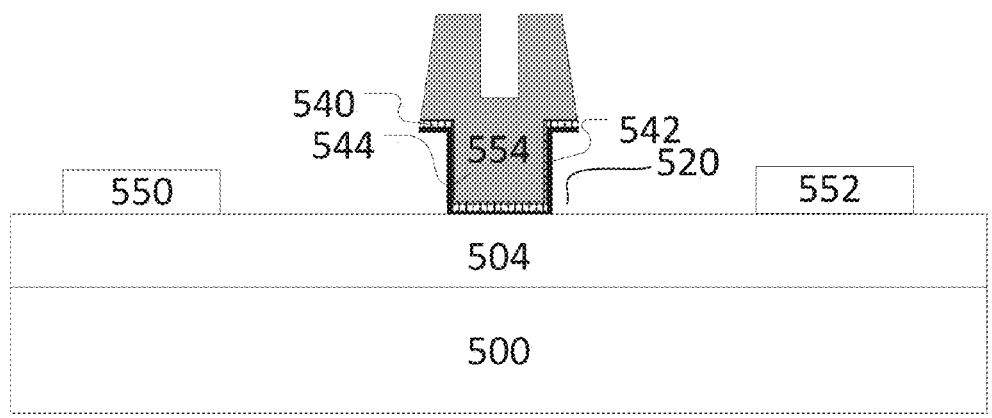
FIG. 5G shows a cross sectional view of the structure shown in FIG. 5E.
Figure 5H:
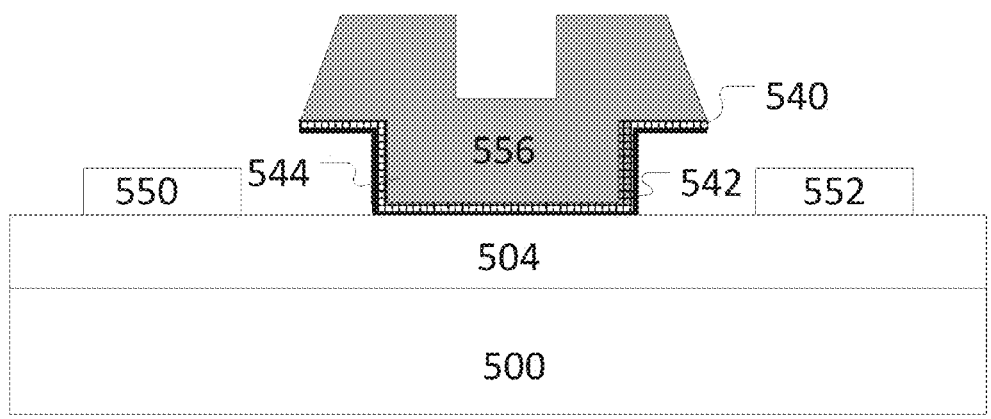
FIG. 5H shows a cross sectional view of the structure shown in FIG. 5E.

Thereafter, source electrode 550 and drain electrode 552 are deposited both on the substrate and above the layer of nanomaterial by appropriate application of photoresists prior to e-beam evaporation of metal, as shown in FIG. 5D. As shown in FIG. 5E, a top-gate electrode 554 (together with an underlying dielectric layer) is fabricated above the layer of nanomaterial 510 to yield a transistor 502. When the top-gate electrode is T-shaped, the techniques illustrated in FIGS. 2E-2I can be used to deposit such a T-shaped top gate electrode 554 and gate dielectric material 540 on the layer of nanomaterial 510. Cross sections of various portions of the transistor 502 are shown in FIGS. 5F-5H. FIG. 5F shows the T-shaped top gate electrode 554 having a foot portion 544, deposited above the layer of nanomaterial 510. FIG. 5G shows the T-shaped top gate electrode 554 deposited in the pattern of anchor points 520, which is void of the layer of nanomaterial 510. The T-shaped top gate electrode 554 can have an underlying dielectric passivation layer 542, which is used to help define the shape of the T-shaped top gate electrode 554.

A portion 556 of the top-gate electrode 554 can optionally extend to a region beyond an edge of the layer of the nanomaterial 510, as shown in FIG. 5H, to allow even better adhesion of the top-gate electrode to the substrate 500 by providing an additional anchoring area at the very end (or front) of the top-gate electrode. In addition, a portion of this optional extension 556 can have a wider foot-print (i.e., a wider foot portion 544) to further increase an anchoring area in contact with the substrate 500. The foot-print of the top-gate can be altered by suitably changing the shape of an opening in the photoresist used to shape the top-gate electrode.

The regions void of nanomaterial provide anchor points for the gate-structure to more strongly adhere to the substrate. The pattern of anchor points increases a surface area of the substrate that is in contact with the layer of gate dielectric material and the gate electrode. In general, and without wishing to be bound to any specific theory, the bond between a nanomaterial like CNT to the substrate is weaker than the bond between the gate structure (which includes the gate-dielectric and the gate metal) due to the non-planar geometry of the CNT and the weak Van der Waals forces between the CNT and the substrate. In contrast, the dielectric gate layer and the top-gate electrode (formed by vapor deposition) can form stronger bonds to the substrate. The adhesion issue can be greater for a gate-structure built on top of a dense carbon nanotubes network, e.g., a density of more than 10 tubes/µm.

In addition to embodiments in which the top-gate electrodes are formed over the pattern of anchor points, metallic portions connected by air-bridges (e.g., metallic portions 332 and 334) can be formed above or directly on the pattern of anchor points to improve adhesion these metallic portions to the substrate.

The methods and systems described herein enable photolithography based manufacture of various 3D shaped structures, such as air-bridges and T-shaped top gate electrodes.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. For example, it should be understood that terms of positioning and orientation (e.g., top, vertical) have been used to describe the relative positioning and orientation of components, but the components can be held in various positions or orientation (e.g., a vertical or horizontal orientation or some other orientation). Moreover, the separation of various system components in the embodiments described above should not be understood as requiring such separation in all embodiments.

Thus, particular embodiments of the invention have been described. Other embodiments are within the scope of the following claims. For example, the actions recited in the claims can be performed in a different order and still achieve desirable results.

What is claimed is:
1. A method comprising:
depositing a first photoresist layer having a first thickness above a substrate;

defining a first opening in the first photoresist layer by exposing the first photoresist layer to radiation, the first opening having a first width;

depositing a conformal passivation layer directly on the first photoresist layer;

depositing a second photoresist layer having a second thickness on the conformal passivation layer;

defining a second opening in the second photoresist layer by exposing the second photoresist layer to radiation, the second opening having a second width greater than the first width;

depositing a conformal dielectric layer directly on the second photoresist layer and above the first photoresist layer;

depositing a metal layer above the first photoresist layer and the substrate to form an electrode, a dielectric layer being provided to contact the metal layer; and removing the first photoresist layer and the second photoresist layer, wherein the first photoresist layer comprises a positive photoresist, and wherein depositing the metal layer comprises depositing a metal layer directly on the conformal dielectric layer, and the conformal passivation layer comprises an inorganic oxide layer.

2. The method of claim 1, wherein depositing the conformal dielectric layer comprises depositing the conformal dielectric layer directly on the second photoresist layer and directly on the conformal passivation layer.

3. The method of claim 1, wherein the conformal dielectric layer comprises $HfO_2$.

4. The method of claim 3, wherein the conformal passivation layer comprises $Al_2O_3$.

5. The method of claim 1, further comprises etching away a portion of the conformal passivation layer not covered by the second photoresist prior to depositing the conformal dielectric layer directly on the second photoresist layer.

6. The method of claim 1, further comprising, before depositing the conformal passivation layer, baking the first photoresist at a temperature higher than a threshold temperature to reflow the first photoresist and reduce a dimension of the first opening.

7. The method of claim 1, further comprising applying a chemical shrink formulation to reduce a dimension of the first opening before depositing the conformal passivation layer.

8. The method of claim 1, wherein a thickness of the conformal dielectric layer is controlled using atomic layer deposition.

9. The method of claim 8, wherein the conformal dielectric layer is deposited below a threshold temperature to reduce or prevent reflow of the photoresists.

10. The method of claim 1, wherein the substrate has a nanomaterial layer deposited thereon, and depositing the first photoresist layer comprises depositing the first photoresist layer on at least a portion of the nanomaterial layer.

11. The method of claim 10, further comprising depositing the nanomaterial layer on the substrate prior to depositing the first photoresist layer.

12. The method of claim 10, where in the nanomaterial layer comprises single wall carbon nanotubes (SWNT).

13. The method of claim 10, further comprising forming a self-aligned source electrode and a self-aligned drain electrode on the nanomaterial layer by using the electrode formed by the deposited metal layer as a shadow mask, wherein a first volume defined by the first opening is contiguous to a second volume defined by the second opening, and a shape of the electrode formed by the deposited metal layer is based collectively on the first volume and second volume.

14. The method of claim 1, wherein the second photoresist layer comprises a positive resist material and the conformal passivation layer prevents the first photoresist layer from being modified when the second opening is defined in the second photoresist layer.

15. The method of claim 1, wherein defining the second opening in the second photoresist layer comprises exposing and developing the second photoresist.

16. The method of claim 1, wherein the metal layer comprises Ti.

17. The method of claim 1, wherein the metal layer comprises Au.

18. The method of claim 1, wherein the first opening is between 100 to 500 nm and the second photoresist layer has a thickness that reduces deposition of metal on a sidewall of the second photoresist layer contiguous to the second opening.

* * * * *